(12) United States Patent
Gupta et al.

(10) Patent No.: US 8,913,652 B2
(45) Date of Patent: Dec. 16, 2014

(54) METHOD, SYSTEM AND APPARATUS FOR WIDEBAND SIGNAL PROCESSING

(75) Inventors: Divi Gupta, Hopkinton, MA (US); Dev V. Gupta, Concord, MA (US)

(73) Assignee: Newlans, Inc., Acton, MA (US)

( * ) Notice: Subject to any disclaimer, the term of this patent is extended or adjusted under 35 U.S.C. 154(b) by 885 days.

(21) Appl. No.: 12/921,987

(22) PCT Filed: Mar. 10, 2009

(86) PCT No.: PCT/US2009/001512
§ 371 (c)(1),
(2), (4) Date: Oct. 21, 2010

(87) PCT Pub. No.: WO2009/114123
PCT Pub. Date: Sep. 17, 2009

(65) Prior Publication Data
US 2011/0051782 A1    Mar. 3, 2011

Related U.S. Application Data

(60) Provisional application No. 61/068,802, filed on Mar. 10, 2008, provisional application No. 61/068,720, filed on Mar. 10, 2008.

(51) Int. Cl.
*H03H 7/30* (2006.01)
*H03H 7/40* (2006.01)
*H03H 11/12* (2006.01)

(52) U.S. Cl.
CPC .......... *H03H 11/1291* (2013.01); *H03H 11/12* (2013.01); *H03H 11/1252* (2013.01); *H03H 2240/00* (2013.01)
USPC ....................................................... 375/229

(58) Field of Classification Search
CPC .......... H03H 11/1252; H03H 11/1291; H03H 2240/00; H03H 11/12

USPC .......... 375/140, 148, 229, 244, 296, 297, 346
See application file for complete search history.

(56) References Cited

U.S. PATENT DOCUMENTS

| 3,434,060 A | 3/1969 | Painter et al. |
| 3,978,416 A | 8/1976 | Sutphin, Jr. |

(Continued)

FOREIGN PATENT DOCUMENTS

| EP | 0579875 A1 | 1/1994 |
| GB | 2 439 116 A | 12/2007 |

(Continued)

OTHER PUBLICATIONS

Notification Concerning Transmittal of International Preliminary Report on Patentability for Int'l Application No. PCT/US2009/001512; Date Mailed: Sep. 23, 2010.

(Continued)

*Primary Examiner* — Syed Haider
(74) *Attorney, Agent, or Firm* — Hamilton, Brook, Smith & Reynolds, P.C.

(57) ABSTRACT

Embodiments include methods, systems, and apparatuses capable of dynamically and adaptively operating on wideband signals. Examples include state variable filters whose center frequencies can be tuned using variable gain blocks coupled to outputs of filter integrators. First- and second-order state variable filters may operate on signals in parallel and their outputs combined to produce a filtered output. Filters may be tuned to pass or reject signals depending on the application; sample applications include, but are not limited to: agile filtering; spectrum analysis; interference detection and rejection; equalization; direct intermediate-frequency transmission; and single-sideband modulation and demodulation.

31 Claims, 17 Drawing Sheets

(56) References Cited

U.S. PATENT DOCUMENTS

| | | | |
|---|---|---|---|
| 4,086,539 | A | 4/1978 | Gustafson et al. |
| 4,179,665 | A | 12/1979 | Gregorian |
| 4,507,791 | A * | 3/1985 | Gundry .................. 375/244 |
| 5,144,258 | A | 9/1992 | Nakanishi et al. |
| 5,325,204 | A * | 6/1994 | Scarpa ................... 348/607 |
| 5,574,678 | A | 11/1996 | Gorecki |
| 5,959,871 | A | 9/1999 | Pierzchala et al. |
| 6,118,794 | A | 9/2000 | Cornfield et al. |
| 6,359,507 | B1 | 3/2002 | Myer |
| 6,424,209 | B1 | 7/2002 | Gorecki et al. |
| 6,677,876 | B1 | 1/2004 | Hoggarth et al. |
| 6,765,377 | B1 | 7/2004 | Lu |
| 6,774,719 | B1 | 8/2004 | Wessel et al. |
| 7,158,591 | B2 | 1/2007 | Harris |
| 7,733,950 | B2 | 6/2010 | Ko |
| 8,483,626 | B2 | 7/2013 | Gupta |
| 8,779,832 | B2 | 7/2014 | Gupta |
| 2001/0041957 | A1 * | 11/2001 | McCann et al. ........... 701/41 |
| 2002/0114270 | A1 | 8/2002 | Pierzga et al. |
| 2002/0196876 | A1 * | 12/2002 | Takada .................... 375/346 |
| 2003/0076907 | A1 * | 4/2003 | Harris ..................... 375/350 |
| 2003/0155922 | A1 | 8/2003 | Royle et al. |
| 2004/0021594 | A1 * | 2/2004 | Melanson ................ 341/143 |
| 2005/0038847 | A1 * | 2/2005 | Cheng et al. ............ 709/201 |
| 2005/0052226 | A1 | 3/2005 | Doerrer |
| 2005/0077960 | A1 | 4/2005 | Kim et al. |
| 2005/0130609 | A1 | 6/2005 | Nagode et al. |
| 2005/0266805 | A1 * | 12/2005 | Jensen ...................... 455/82 |
| 2005/0275577 | A1 * | 12/2005 | Bjornsen ................. 341/155 |
| 2006/0092057 | A1 * | 5/2006 | Slavin ..................... 341/118 |
| 2006/0158247 | A1 * | 7/2006 | Lee ........................... 330/10 |
| 2006/0186995 | A1 | 8/2006 | Wu et al. |
| 2006/0261846 | A1 | 11/2006 | Twigg |
| 2006/0284687 | A1 * | 12/2006 | Abel ......................... 331/16 |
| 2007/0146071 | A1 | 6/2007 | Wu |
| 2007/0286264 | A1 * | 12/2007 | Kontola et al. .......... 375/152 |
| 2009/0184769 | A1 | 7/2009 | Lee et al. |
| 2011/0051782 | A1 | 3/2011 | Gupta et al. |
| 2013/0106487 | A1 | 5/2013 | Gupta |
| 2013/0293264 | A1 | 11/2013 | Gupta |
| 2013/0293308 | A1 | 11/2013 | Gupta |

FOREIGN PATENT DOCUMENTS

| | | |
|---|---|---|
| JP | 2007-058596 A | 3/1995 |
| JP | 2007-240664 A | 9/1995 |
| JP | 2008-122408 A | 5/2008 |
| JP | 2011-526428 | 10/2011 |
| WO | WO 02/095990 A1 | 11/2002 |
| WO | WO 2006-131565 A1 | 12/2006 |
| WO | WO 2011/152896 A1 | 12/2011 |
| WO | WO 2012/061385 A1 | 5/2012 |
| WO | WO 2012/064551 A2 | 5/2012 |

OTHER PUBLICATIONS

Franco, Sergio, "State-Variable and Biquad Filters" (Jan. 1, 1988), In *Design With Operational Amplifiers and Analog Integrated Circuits*, (McGraw-Hill Book Company), pp. 136-145, XP009153311.

S.P. et al. 'A Transmitter IC for TETRA Systems Based on Cartesian Feedback Loop Linearization Technique', In: IEEE Journal of Solid-State Circuits, vol. 40, No. 3, Mar. 2005, pp. 707-718.

C.J.S. et al. 'A new adaptive double envelope feedback (ADEF) linearizer for mobile radio power amplifiers', In: IEEE MIT-S International Microwave Symposium Digest, 1994, pp. 573-576.

Notification Concerning Transmittal of International Preliminary Report on Patentability PCT/US2011/058785 "Method and Apparatus for Power Amplifier Linearization," Date of Mailing ,May 16, 2013.

International Search Report and Written Opinion of the International Searching Authority mailed Feb. 9, 2012 from PCT/US2011/058785 filed Nov. 1, 2011.

Notification of Transmittal of The International Search Report and the Written Opinion of the International Searching Authority, or the Declaration for PCT/US2011/058786 mailed Jun. 29, 2012.

Notification Concerning Transmittal of International Preliminary Report on Patentability PCT/US2011/058786 "Field-Programmable Analog Array" Date of Mailing, May 23, 2013.

Notification of Transmittal of The International Search Report and the Written Opinion of the International Searching Authority, or the Declaration for PCT/US2012/062965 mailed Feb. 26, 2013.

Notification of Transmittal of The International Search Report and the Written Opinion of the International Searching Authority, or the Declaration for PCT/US2009/001512 mailed Oct. 20, 2009.

Supplementary European Search Report, Application No. EP 09721007 dated Nov. 17, 2011.

Notification of Transmittal of The International Search Report and The Written Opinion of the International Searching Authority, of the Declaration, PCT/US2011/024542, Date Mailed: Oct. 31, 2011.

International Preliminary Report on Patentability, International Application No. PCT/US2011/024542, Date Mailed: Aug. 23, 2012.

Notification of Transmittal of the International Search Report and the Written Opinion of the International Searching Authority, or the Declaration for PCT/US2013/057996, "Bi-Quad Calibration", mailed Dec. 26, 2013.

Notification Concerning Transmittal of International Preliminary Report on Patentability, International Application No. PCT/US2012/062965, "Wideband Signal Processing," date mailed, May 15, 2014.

Notice of Allowance in U.S. Appl. No. 13/576,635, dated Jul. 11, 2014.

Supplementary European Search Report, Application No. EP 11790125, "Broadband Analog Radio-Frequency Components," date May 12, 2014.

* cited by examiner

METHOD, SYSTEM AND APPARATUS FOR WIDEBAND SIGNAL PROCESSING

RELATED APPLICATIONS

This application is the U.S. National Stage of International Application No. PCT/US2009/001512, filed Mar. 10, 2009, which designates the U.S., published in English, and claims the benefit of U.S. Provisional Application No. 61/068,720, filed Mar. 10, 2008 and U.S. Provisional Application No. 61/068,802, filed Mar. 10, 2008. The entire teachings of the above applications are incorporated herein by reference.

BACKGROUND

Increases in signal bandwidth and data rates have prompted the development of new signal processing techniques to solve challenges associated with wideband signals. Increased signal bandwidth has also made new applications possible, including ultrawideband (UWB) technology-based active radio-frequency (RF) identification (ID) in heterogeneous environments. In addition, increasing signal bandwidth improves ranging accuracy, making wideband technologies especially attractive for radar, imaging, and other applications.

Unfortunately, fundamental scaling limits on clock speed, switching, heat dissipation, and difficulty of fault recovery make digital logic unsuitable for wideband signal processing. For example, today's DSP technology cannot process the wideband signals required for emerging applications such as high-definition TV, software-defined radio, cognitive radio, 4-G handheld services, white spaces, UWB-based services, and real-time GHz/THz medical imaging. Beyond the need for greater speed and bandwidth processing capability, methods for reducing power consumption also have huge appeal and utility in many signal processing applications. For example, a huge premium is placed on power consumption in mobile devices; high-speed DSPs are a huge drain on the battery life of cell-phones and PDAs.

For wideband applications, the Nyquist rate is in the multiple Gsps range and, hence, only relatively simple signal processing can be implemented and often requires highly pipelined and parallel processing architectures. Going forward, DSP technology is unlikely to reach the capabilities required by these applications because the limits of CMOS-based digital signal processing structures are not expanding according to Moore's Law any more. In fact, deep sub-micron CMOS gates have widths measured in molecules, suggesting that transistor sizes (and switching speeds) are nearing their fundamental limits. In other words, there is little room to increase the bandwidth processing ability of DSP technology because transistor switching speed, which is inversely related to transistor size, cannot get much faster.

Analog logic, in turn, has its own limitations. Because analog circuits are not formed of truly independent blocks, changing one block of analog logic can force changes in every other block in the circuit. In addition, advances in process technology occur so quickly that application-specific designs often become obsolete before they are fabricated. Finally, analog circuits are neither fully reconfigurable nor fully programmable.

SUMMARY

Embodiments of the present invention include methods and apparatuses for wideband signal processing using an $m^{th}$-order state variable filter and an $n^{th}$-order state variable filter configured to operate on a wideband input in parallel, where m and n are positive integers, and a summer configured to combine outputs from the $m^{th}$ and $n^{th}$-order state variable filters to produce a processed output. In some embodiments, m and n may be equal to each other. In other embodiments, m may equal one (1) and n may equal two (2). Embodiments may include plural mth-order filters, plural nth-order filters, or combinations of plural mth- and nth-order filters.

Further embodiments may include an analog-to-digital converter (ADC) configured to digitize the processed output and a digital signal processor (DSP) configured to control the $m^{th}$- and $n^{th}$-order state variable filters based on the digitized version of the processed output. The DSP may change the center frequencies, passband shapes, and passband widths of the filters by changing filter parameters, including tap weights, fractional gains, poles, residues, and variable gains. For example, the DSP may adjust the state variable filters to compensate for non-idealities of integrators and other filter components.

Still further embodiments include a first-order state variable filter with a residue block, summer, integrator, variable gain block, and pole block. The residue block can be configured to provide a residue of the wideband input to the summer, which combines the residue with a pole from the pole block. The integrator integrates the combined signal from the summer and forwards a resulting integrated signal to the variable gain block, which, in turn, amplifies the integrated signal to provide a filtered output. The pole block provides the pole of the filtered output to the summer, closing a feedback loop. The center frequency of the filter can be controlled by varying a gain of the variable gain block.

Yet further embodiments include second-order state variable filters that comprise two integration/gain stages, each of which includes an integrator operably coupled to a variable gain block. A first summer feeds a combined signal based on a wideband input to the first integration/gain stage, which, in turn, provides an input to the second integration/gain stage to provide an output signal. Example second-order state variable filters may also include fractional gain blocks and additional summers. Varying gains of the first and second variable gain blocks changes a center frequency of the embodiment second-order state variable filters.

Still other embodiments include a method of filtering wideband signals by combining a pole of a filtered signal with a wideband input to provide a combined signal; integrating the combined signal to provide an integrated signal; and amplifying the integrated signal by a gain G to provide the filtered signal, where the center frequency of the filter is scaled by the gain G.

Methods may also include determining residues and poles of input, output, and intermediate signals. In addition, methods may include integrating the filtered signal to provide another integrated signal; amplifying the other integrated signal to provide another filtered signal; combining the other integrated signal with the combined signal before integrating the combined signal; and adding the other filtered signal to the difference signal to provide an output. Certain methods may also involve adjusting the pole, residue, or gain to compensate for non-idealities, such as finite integration bandwidth or finite integration gain, when integrating the difference signal.

Changing the gain G results in a corresponding change in center frequency of the filtered signal. The filter center frequency may be swept across a frequency band by changing the gain G and the transmitted signal may be measured as a function of the gain/filter center frequency. This method may be used to detect interfering signals; after the interfering signals have been detected, they may be rejected by adjusting the gain and other filter parameters.

Other methods include mixing filtered signals with local oscillators to produce intermediate-frequency (IF) signals, which may be tuned by adjusting the gain G. Certain embodiments include processing a training signal, then determining equalization factors based on measurements of the processed training signal. Filter parameters, including the gain G, may be adjusted based on the equalization factors to equalize the filtered signal.

Alternatively, signals may be cascaded through serially connected filters arranged in a tapped delay line, where the filter gains, poles, and residues are adjusted to achieve desired delay performance. Outputs from each filter may be scaled by adjustable tap weights. Combining the scaled outputs from each filter provides a correlation or equalization of the input signal, given appropriately chosen tap weights and inputs.

Embodiments also include a transceiver configured to receive an ultrawideband (UWB) signal via an antenna. A spectrum analyzer provides a characterization of the UWB signal, which may be used to set a reconfigurable band-reject filter to null detected interferers. Changing a gain of the band-reject filter adjusts a center frequency of the band-reject filter.

Alternative embodiments include a tapped delay line comprising plural state variable filter delay elements arranged in series. Each element includes an $n^{th}$-order state variable filter and an $m^{th}$-order state variable filter configured to operate on a wideband input in parallel and a summer configured to add outputs from the $n^{th}$- and $m^{th}$-order state variable filters.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Figure 1:
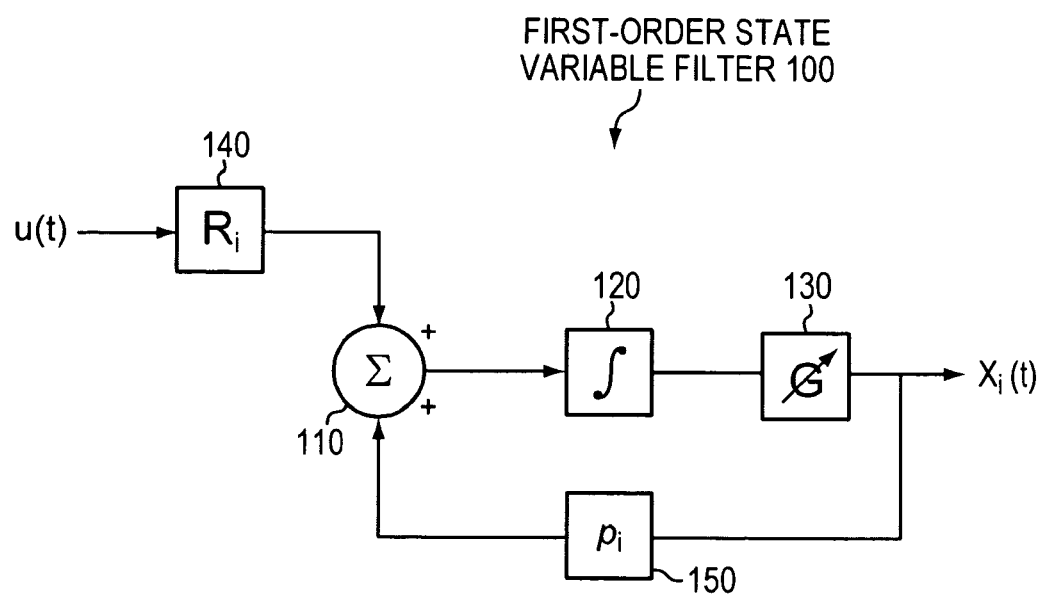
FIG. 1 is a block diagram of a first-order state variable filter.

A description of example embodiments of the invention follows.

Wideband and ultrawideband (UWB) communication systems, which spread signal energy finely across an enormous frequency band (e.g., 3.7-10.0 GHz), appear promising for many wireless applications. Many of wideband communication's attributes—accurate ranging, material penetration, overlay, and robustness to multipath fading in low-power systems operating in extreme environments—directly address the critical challenges facing challenging military and commercial applications, such as radio-frequency identification (RFID). In addition, wideband systems that operate at baseband do not require down-conversion at the receiver, simplifying the required receiver.

The challenges of designing a wideband system with finely spread energy over an extremely large frequency band to meet the overlay requirement soon become apparent to communication system designers. In particular, one generally selects a receiver design that is scalable to extreme bandwidths (7 GHz now, potentially larger in the future) from among all-digital receivers, analog correlators for partial or full rake receivers, and transmitted reference receivers.

Analog-to-digital (A/D) conversion limits the bandwidth and dynamic range (resolution) of all-digital receivers. At present, the high-fidelity A/D converters capable of adequately sampling baseband UWB signals are too complex and consume too much power, particularly for RFID applications. Alternative all-digital systems rely on low-resolution A/D converters, but do not perform as well. For analog correlators, as the bandwidth grows, the number of rake fingers for efficient energy capture increases, and, thus, so does the circuit complexity and difficulty of channel estimation. Although transmitted reference receivers are attractive for low-to-moderate data rate operations, they require large-bandwidth delay lines at the receiver for UWB applications.

Here, we disclose wideband signal processing (WiSP) that augments digital signal processing and vastly improves the bandwidth processing capability of such systems. The disclosed WiSP systems and techniques provide general-purpose signal processing for wideband signals by implementing and extending digital functionalities in the analog domain. Embodiments of the disclosed invention employ a state variable-based architecture to implement any desired impulse response or transfer function to a specifiable degree of accuracy. All filter parameters, including center frequency, can be controlled and optimized through algorithms running on a low data rate, wideband digital signal processor (DSP) or other suitable control element running in the control path. Wideband signal processors can be implemented on sub-micron complementary metal-oxide-semiconductor (CMOS) structures to permits processing of broadband signals, including signals whose bandwidths exceed 10 GHz.

Embodiments of the disclosed WiSP systems and devices include dynamically and reconfigurable filters that can be used as or in: wideband filters; agile filters; adaptive filters; equalizers; direct intermediate-frequency (IF) transmitters; and single-sideband modulators and demodulators. Filters, processors, equalizers, and tapped delay lines made according to principles of the present invention can be used in a wide variety of applications, including, but not limited to: active RFID; radar; imaging; software-defined radio; cognitive radio; baseband processors; instrumentation; and wireless high-definition multimedia interfacing. These lists of components and applications are not exhaustive; rather, they are representative of components and applications suitable for manufacture or use according to principles of the present invention.

Filters for Analog Signal Processing

Classic signal processing systems operate on two planes. In the signal plane (S-plane), signals are, manipulated using filters and other processing operations. In the control plane (C-plane), the signal processing operations are provisioned and manipulated. For example, in an adaptive equalization system, signals pass through a transversal filter, but the coefficients of the filter are controlled by the C-plane. Today, both these functions are done by DSPs. The underlying mathematical basis for digital signal processing is based on S-plane theory, synchronous sampling at or above the Nyquist sampling rate—governed by the sampling theorem. Needless to say, systems implementing such functionality rely on the use of DSP, A/D, and digital-to-analog (D/A) technologies.

In embodiments disclosed here, the S-plane undergoes sophisticated analog signal processing (the signal path is all analog) while maintaining 10+ GHz of bandwidth. The C-plane, however, is implemented in a traditional A/D, D/A, and DSP architecture. Embodiments disclosed herein have extremely low power consumption relative to today's standards because of the resulting low gate count and block-architecture of these hybrid systems.

Filters are building-block components for analog signal processors that alter the amplitude and/or phase characteristics of a signal with respect to frequency, making it possible to process signals in the S-plane. Filters are used to pass signals within certain frequency ranges and to reject those in other ranges. Bandpass filters transmit only those frequencies that fall within a given band. Notch or band-reject filters, on the other hand, remove specific frequencies while allowing all other frequencies to pass undisturbed. Low-pass and high-pass filters reject frequencies above and below, respectively, a cut-off frequency. All-pass filters impart phase shifts on an input signal without attenuating the signal.

A filter's frequency response can be represented mathematically by a transfer function, which is the ratio of the Laplace Transforms of its output and input signals. Ideal filters have rectangular transfer functions; that is, transfer functions with infinitely steep boundaries between the pass and stop bands, and a constant gain in the pass band. In addition, ideal filters have linear phase responses to avoid introducing phase distortion into the signal. Real filters can only approximate the ideal response.

The order of a filter equals the order of the polynomial expansion of the filter's transfer function. In conventional RF systems, higher-order filters are constructed by cascading (i.e., serially connecting) lower-order filters. For example, a third-order filter can be constructed by connecting the output of a first-order filter to the input of a second-order filter. Higher-order filters typically have improved pass band performance and a faster roll-off (attenuation in the stop band) than lower-order filters.

Filter Design, Implementation, and Operation

Normally, when designing filters, the goal is to implement a particular transfer function or impulse response. Transfer functions corresponding to rational functions take the form:

$$T_{mn}(s) = \frac{b_m s^m + b_{m-1} s^{m-1} + \ldots + b_0}{s^n + a_{n-1} s^{n-1} + \ldots + a_0} \quad (1)$$

where $s = j\omega$ and is given in rad·Hz. Solutions to the numerator are the filer's zeros; solutions to the denominator are the filter's poles. A partial fraction expansion can be done on this expression, followed by an inverse Laplace transform, allowing any temporal function to be expressed as a sum of complex sinusoids:

$$T_{mn}(s) = \sum_{i=1}^{n} \frac{R_i}{s - p_i} \Leftrightarrow y_{mn}(t) = \sum_{i=1}^{n} R_i e^{p_i t} \quad (2)$$

This approximation can be made accurate to an arbitrary degree of accuracy by adding additional terms in the summation.

In order to develop an expression for the impulse response in the form of a summation of complex sinusoids, as in equation (2), the Padé approximation, Prony's method, or any other suitable method can be employed to determine values of $R_i$ and $p_i$ of $y_{mn}(t)$. Once $y_{mn}(t)$ is known, it is possible to use state variable techniques. The system described by equation (3) has a solution y(t) that is in the same form as $y_{mn}(t)$ from equation (2).

$$\begin{cases} \dot{x} = \begin{bmatrix} -p_1 & & & & \\ & -p_2 & & 0 & \\ & & -p_3 & & \\ & 0 & & \ddots & \\ & & & & -p_n \end{bmatrix} \underline{x} + \begin{bmatrix} R_1 \\ R_2 \\ R_3 \\ \vdots \\ R_n \end{bmatrix} \underline{u} \\ y = [1\ 1\ 1\ \cdots\ 1]\underline{x} \end{cases} \quad (3)$$

Applying Prony's method or the Padé approximation yields a list of $R_i$ and $p_i$ values, some of which are real and some of which are complex. The complex pole/residue pairs occur as complex conjugate pairs and can be combined as:

$$\begin{aligned} T_p(s) &= \frac{R_i}{s - p_i} + \frac{R_i^*}{s - p_i^*} \\ &= \frac{2\mathrm{Re}[R_i]s - 2\mathrm{Re}[p_i R_i^*]}{s^2 - 2\mathrm{Re}[p_i]s + |p_i|^2} \\ &= \frac{b_1 s + b_0}{s^2 + a_1 s + a_0} \end{aligned} \quad (4)$$

where all the filter coefficients (a's and b's) are real. These conjugate pairs can be realized using the second-order control and observer canonical forms described in greater detail below.

FIG. 1 shows a first-order state variable filter 100 used to implement real solutions to equations (2) and (3). The first-order state variable filter 100 operates on a wideband input u(t) to produce a filtered output $x_f(t)$. A residue block 140 determines the input's residue $R_i$, which is forwarded to a summer 110 that combines the residue with a pole $p_i$ of the filtered output. The summer 110 forwards the sum of the residue and the pole to an integrator 120. Unlike conventional first-order state variable filters, the first-order state variable filter 100 includes a variable gain block 130 that operates on the output of the integrator 120. The variable gain block 130 amplifies or attenuates the integrated signal according to its gain settings G to produce the filtered output. A pole block 150 coupled to the variable gain block 130 produces the pole $p_i$ of the filtered output, which is fed back to the summer 110. Changing the parameters of the pole block 150 and the residue block 140 (i.e., changing the filter tap weights) changes the filter transfer characteristics, including the filter center frequency and pass bandwidth.

Re-examining the first-order state variable filter 100 shown in FIG. 1 shows that the effect of the variable gain block 130 is very interesting. Rather than amplifying the signal, the variable gain block 130 acts as a frequency scale when preceded by the integrator 120 (which is equivalent to 1/s in the Laplace domain). The variable gain block 130 transforms the filter transfer function T(s) into T(s/G), where G is the gain of the variable gain block 130. Given that $s=j\omega=j2\pi f$, scaling s by 1/G effectively scales T(s) in frequency by the same factor of G. Varying G causes the center frequency of the filter passband to tune across the UWB band.

Figure 2:
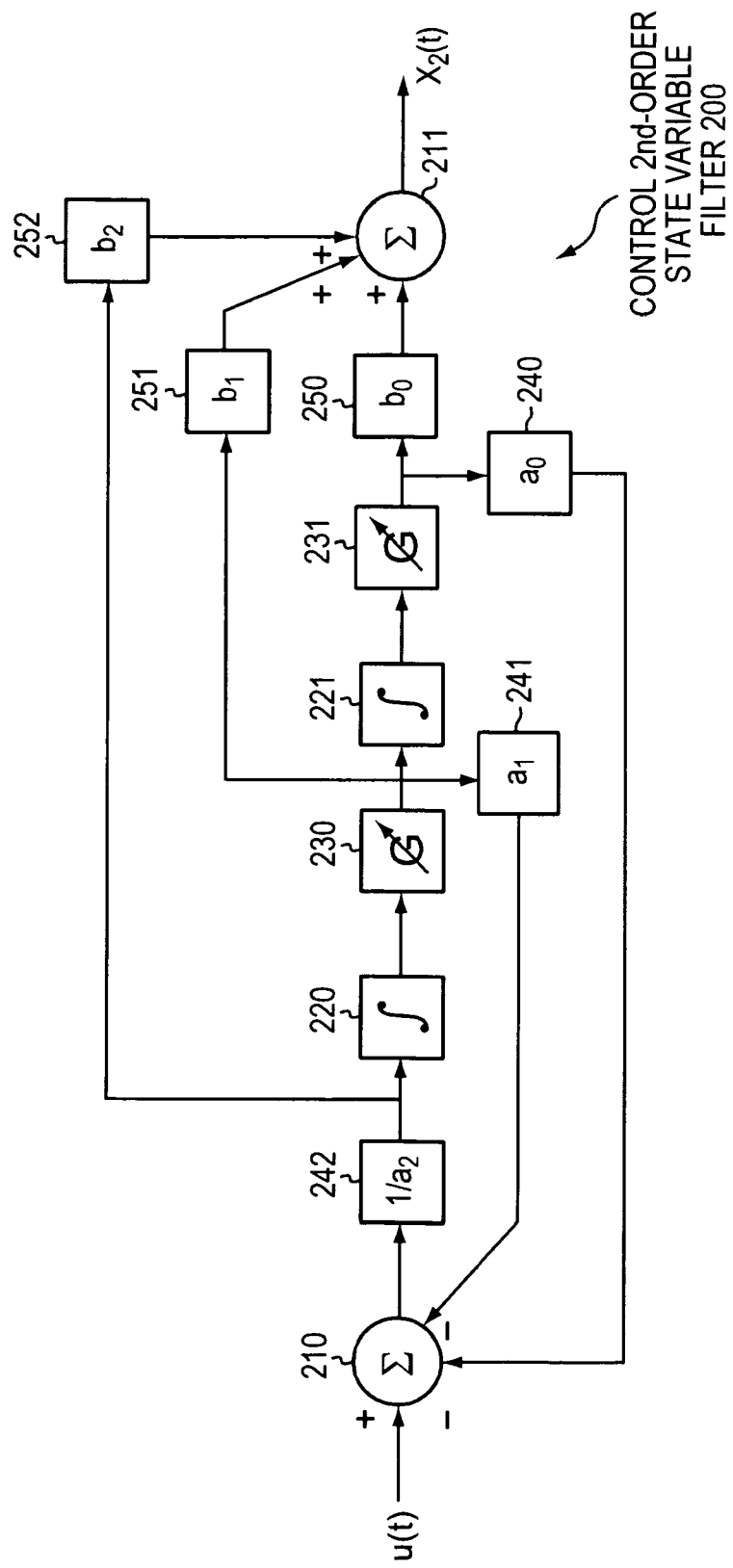
FIG. 2 is a block diagram of a control canonical form of a second-order state variable filter.
Figure 3:
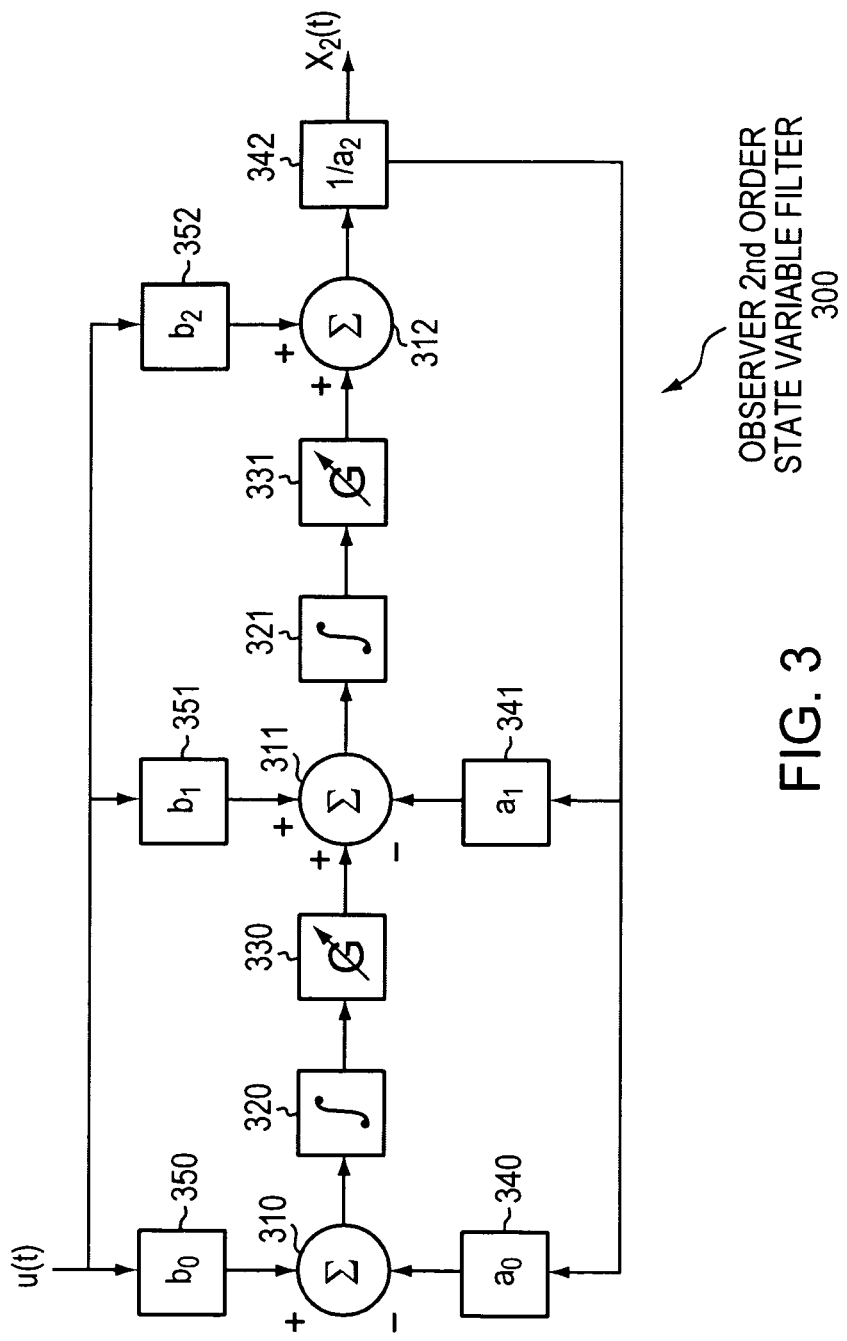
FIG. 3 is a block diagram of am observer canonical form of a second-order state variable filter.

FIGS. 2 and 3 show second-order state variable filters 200 and 300 in control and observer canonical forms, respectively, that realize second-order solutions to equations (2) and (3). The two forms are mathematically equivalent, but the observer form 300 requires an additional summer and has differently configured inputs and outputs. Like the first-order state variable filter 100 shown in FIG. 1, the second-order filters 200 and 300 include variable gain blocks that change the center frequency of the filter passband. They also include tap weights, or fractional gain blocks, that represent coefficients (i.e., $a_0$, $a_1$, $a_2$, $b_0$, $b_1$, and $b_2$) of the transfer function in equation (4). Like the variable gain blocks, the fractional gain blocks attenuate or amplify signals according to a corresponding coefficient. Typically, the variable and fractional gain blocks scale signals to a value within a normalized range of −1 to 1, inclusive.

The control second-order state variable filter 200 shown in FIG. 2 operates on a wideband input u(t) to produce a filtered output $x_2(t)$. A summer 210 combines the wideband input with outputs from fractional gain blocks 240 and 241. The summer 210 passes the difference of the wideband input and the fractional gain block outputs to a third fractional gain block 242, which scales the summer output by an amount $1/a_2$. The fractional gain block 242 forwards the scaled summer output to an integrator 220 and a fractional gain block 252, which scales the scaled summer output by $b_2$.

The integrator 220 integrates the scaled signal, then forwards a resulting integrated signal to a variable gain block 230, which tunes the passed signal frequency according to its gain setting $G_1$. The output of the variable gain block 230 is forwarded to a second integrator 221 and fractional gain blocks 241 and 251, which scale the output by $a_1$ and $b_1$, respectively. The second integrator 221 integrates the signal again, then forwards a resulting second integrated signal to a variable gain block 231. The output of the variable gain block 231 is forwarded to fractional gain blocks 240 and 250, which scale the output by $a_0$ and $b_0$, respectively. A summer 211 combines the outputs of the fractional gain blocks 250-252 to provide the filtered output.

The observer second-order state variable filter 300 shown in FIG. 3 operates on a wideband input u(t) to produce a filtered output $x_2(t)$ in much the same way as the filter 200 shown in FIG. 2. Here, however, fractional gain blocks 350, 351, and 352 scale the wideband input by amounts $b_0$, $b_1$, and $b_2$, respectively, and forward the resulting scaled outputs to summers 310, 311, and 312, respectively. The summer 310 combines (subtracts) a scaled output from fractional gain block 340 with (from) the output of fractional gain block 350 to provide a combined signal.

An integrator 320 integrates the resulting signal, then forwards a resulting integrated signal to a variable gain block 330, which tunes the passed signal frequency according to its gain setting. A second summer 311 combines the output of the variable gain block 330 with outputs from fractional gain blocks 341 and 351 to provide a second combined output.

A second integrator 321 integrates the second combined output, then forwards a resulting second integrated signal to a second variable gain block 331. A third summer 312 combines the second variable gain block's output with the output of the fractional gain block 352 to provide a third combined signal. A fractional gain block 342 scales the third combined signal by $1/a_2$ to provide the filtered output. The filtered output is forwarded to fractional gain blocks 340 and 341, which scale the filtered output by $a_0$ and $a_1$, respectively.

The first- and second-order state variable filters shown in FIGS. 1-3 can be generalized to any order by incorporating or removing additional integrators and variable gain blocks as appropriate. An nth-order state variable filter can be constructed by coupling a variable gain block to the respective outputs of each of n integrators. Higher-order state variable filters may also include additional functional gain blocks and summers configured to scale and combine signals at various points throughout the filter. Setting a functional gain block's scaling coefficient to 0 or 1 (depending on the filter configuration) effectively suppresses the functional gain block's effect on the filter's operation.

Figure 4:
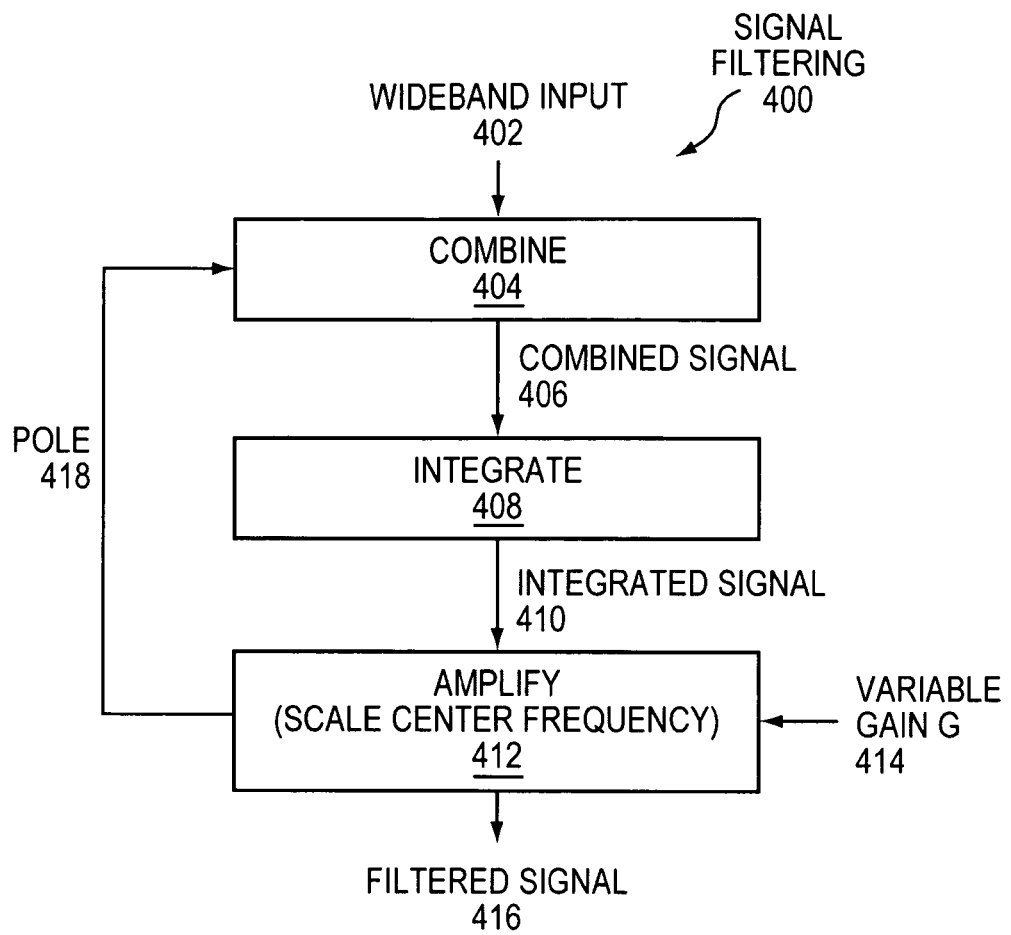
FIG. 4 is flow diagram that illustrates signal filtering according to principles of the present invention.

FIG. 4 is a flow diagram that illustrates basic signal filtering 400 according to principles of the present invention. First, a wideband input 402 is combined (404) with a pole 418 to produce a combined signal 406, where the pole 418 is determined from a filtered signal 416 derived through the signal filtering 400. In higher-order filtering, the pole 418 may be derived by scaling the filtered signal 416 with a fractional gain coefficient. The combined signal 406 is integrated (408) to produce an integrated signal 410, which is amplified (412) by a variable gain 414 to produce the filtered signal 416. Changing the variable gain 414 shifts the center frequency of the filtered signal 416.

Integrators for State Variable Filters

Figure 5A:
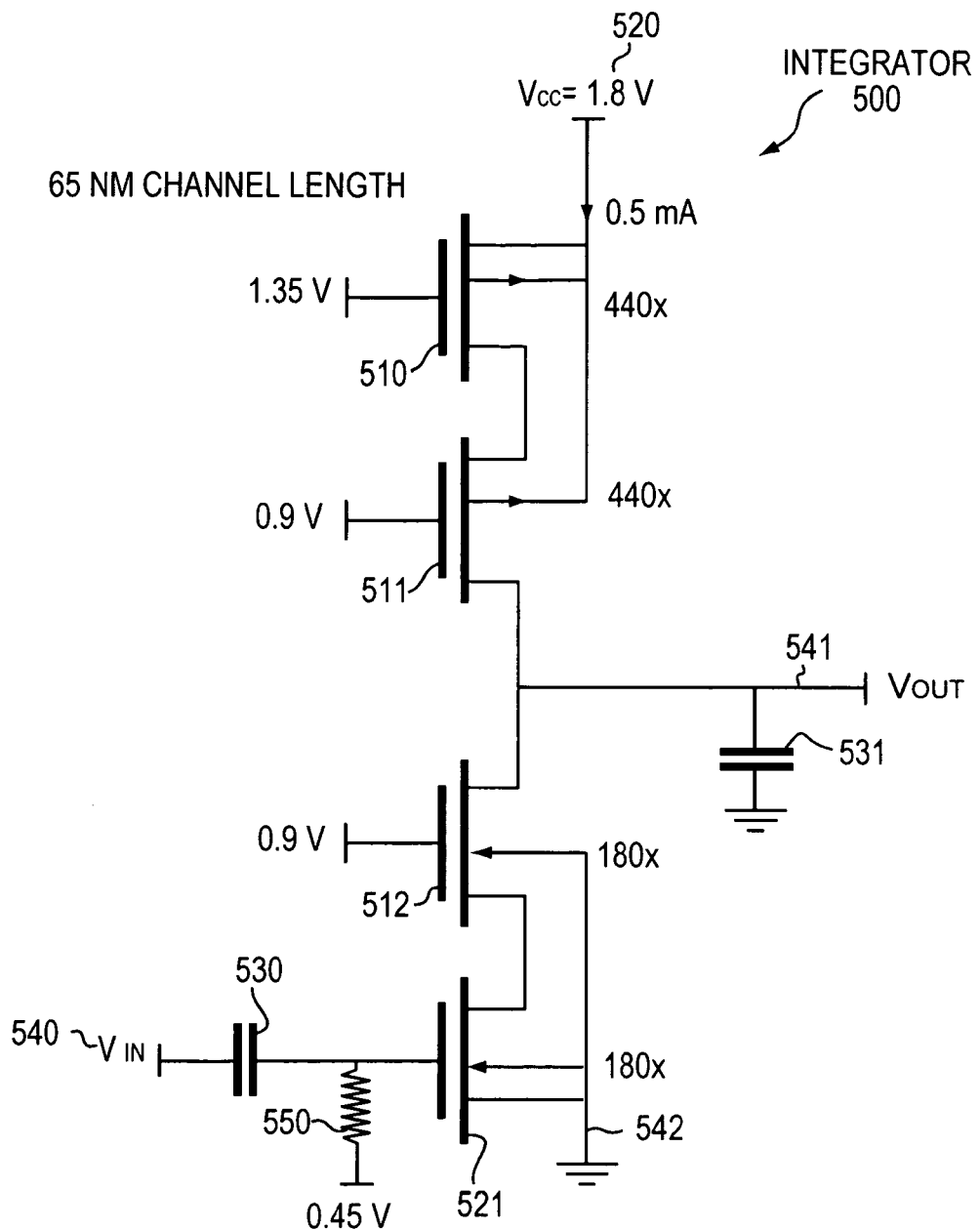
FIG. 5A is a circuit diagram of an integrator suitable for use in the state variable filters of FIGS. 1-3.

FIG. 5A shows a transconductor-based integrator 500 suitable for use in the state variable filters shown in FIGS. 1-3. (Of course, the state variable filters shown in FIGS. 1-3 may use other suitable integrators besides the integrator 500 shown in FIG. 5A.) The integrator includes four metal-oxide-semiconductor field-effect transistors (MOSFETs) 510-513 connected in series between first and second power supply terminals 520 and 522. In certain embodiments, the MOSFETs 510-513 are fabricated using 65 nm complementary metal-oxide-semiconductor (CMOS) processes. The source and drain of the p-channel, enhancement-mode MOSFET 510 are tied to the first power supply terminal and the source of the p-channel, enhancement-mode MOSFET 511, respectively. As shown in FIG. 5A, the gates of the MOSFETs 510 and 511 are biased at 1.35 V and 0.9 V, respectively.

The drain of the MOSFET 511 is tied to an output node 541, which may be filtered using a capacitor 531 tied to ground. The drain of the MOSFET 511 is also connected to the source of the n-channel, enhancement-mode MOSFET 512, which is electrically connected to the source of the n-channel, enhancement-mode MOSFET 513. The gate of the MOSFET 512 is biased at 0.9 V, whereas the gate of the MOSFET 513 is tied to an input node 540 via a high-pass filter constructed of a capacitor 530 and a resistor 550 tied to a 0.45 V potential. The drain of the MOSFET 513 is tied to ground.

Figure 5B:
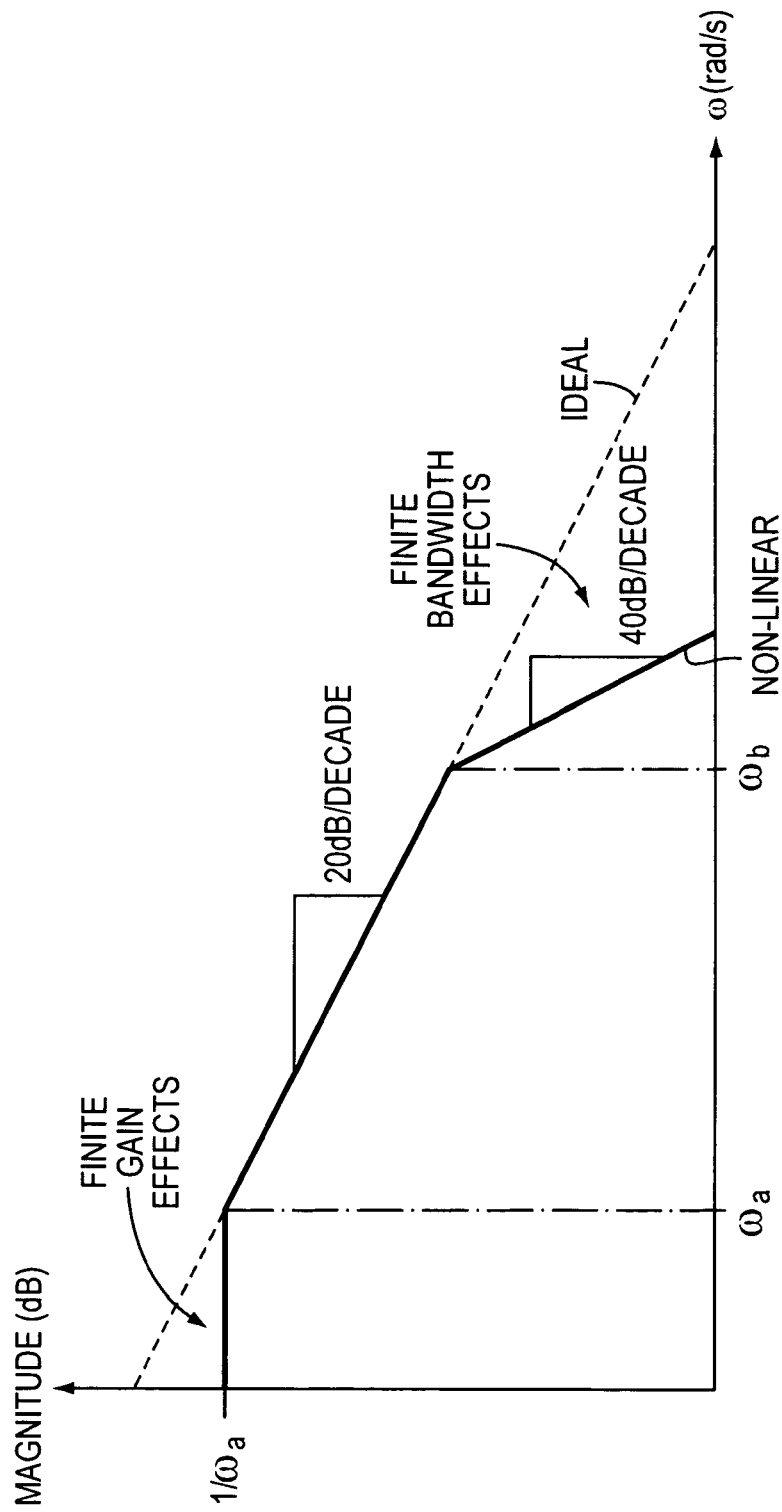
FIG. 5B is a plot of frequency response of ideal and non-ideal integrators.

FIG. 5B is a plot of frequency response for a real (i.e., non-ideal) integrator. Ideal integrators have linear frequency responses with no corners, such as the 20 dB per decade response shown in FIG. 5B. Real integrators, however, have frequency responses that are not perfectly linear. As shown in FIG. 5B, the frequency response is constant at frequencies below the first pole, $\omega_a$. At frequencies above the second pole, $\omega_b$, the response rolls over from −20 dB per decade to −40 dB per decade. These finite bandwidth and finite gain effects degrade filter performance.

Figure 5C:
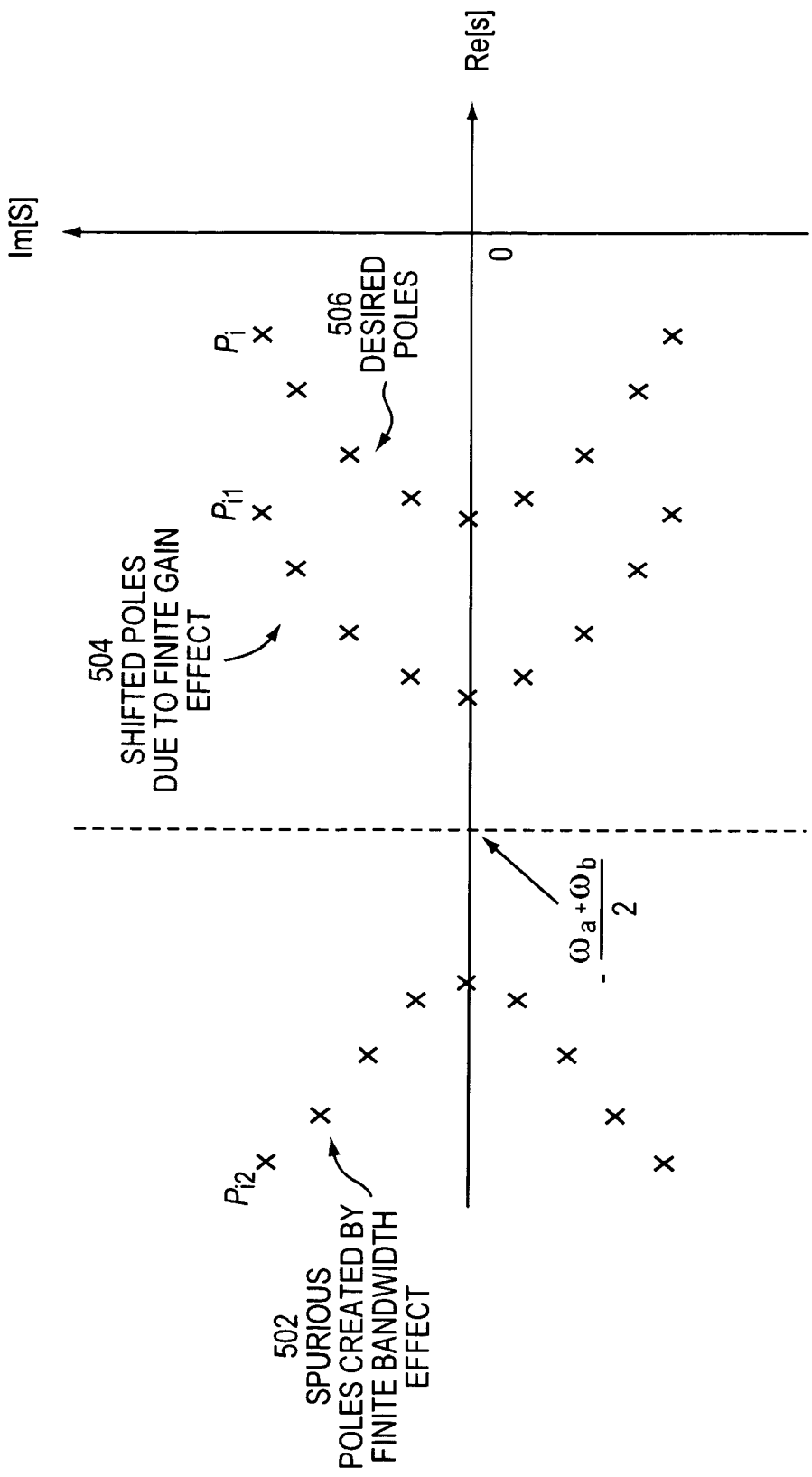
FIG. 5C is a plot of effects of integrator non-idealities on filter poles.

FIG. 5C shows a plot of the effects of finite gain and finite bandwidth of a real (i.e., non-ideal) integrator on the performance of a ninth-order filter. Under non-ideal conditions, the filter poles are distributed symmetrically along the real axis about the line $Re(s)=-(\omega_a+\omega_b)/2$, where $\omega_a$ and $\omega_b$ are solutions of the filter transfer function. Finite bandwidth effects cause the appearance of spurious poles 502, which create a spurious time signal that contaminates the desired response. If the spurious poles are far from the desired poles, however, the spurious time signal is small enough to be ignored.

Finite gain effects cause the desired poles 504 to shift in frequency to different positions 506. These finite gain effects can be mitigated by adjusting the filter fractional gain coefficients to move the desired pole locations 504 right along the Re(s) axis so that the actual poles 504 match the originally desired pole locations 506. In other words, if the actual pole 504 is at s=−1.5 and the desired pole 506 is at s=−1, shifting the desired pole to s=−0.5 causes the actual pole location to shift to −1, compensating the non-ideality.

Wideband Processing with State Variable Filters

The state variable filters described above can be cascaded and their outputs summed to realize the transfer function $T_{mn}(s)$, or, equivalently, $y_{mn}(t)$, in equation (2). In example architectures, the filters can be divided into unit blocks that include summers, integrators, variable gain blocks, and fractional gain blocks. Repetitive architectures make it possible to efficiently create CMOS chips with several unit blocks whose coefficients can be programmed to realize any rational function or mimic any impulse response.

Figure 6:
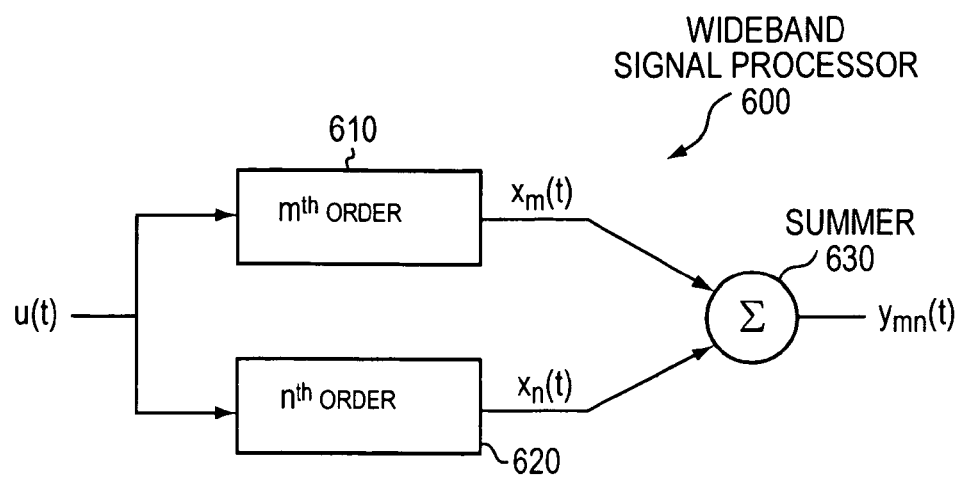
FIG. 6 is a block diagram of a wideband signal processor employing parallel state variable filters.

FIG. 6, for example, shows a wideband signal processor 600 that includes an mth-order state variable filter 610 and an nth-order state variable filter 620 that operate in parallel on a wideband input u(t). A summer 630 combines outputs $x_n(t)$ and $x_n(t)$ from filters 610 and 620, respectively, to produce a processed output $y_{mn}(t)$. The aggregate filter order n+m is the sum of the orders the individual filters 610 and 620, where n and m can be any positive integer. The individual filters 610 and 620 may be of the same order or different orders, depending on the embodiment. In addition, the transfer function of the processor 600 can be adjusted by adjusting tap weights or fractional gains of the individual filters 610 and 620.

Alternative wideband signal processors may include more filters operating in parallel on the same input. These additional filters are also coupled to the common summer (e.g., summer 630) to provide the processed output. In embodiments with more than two state variable filters, the aggregate filter order is the sum of the orders of the individual filter orders.

Figure 7:
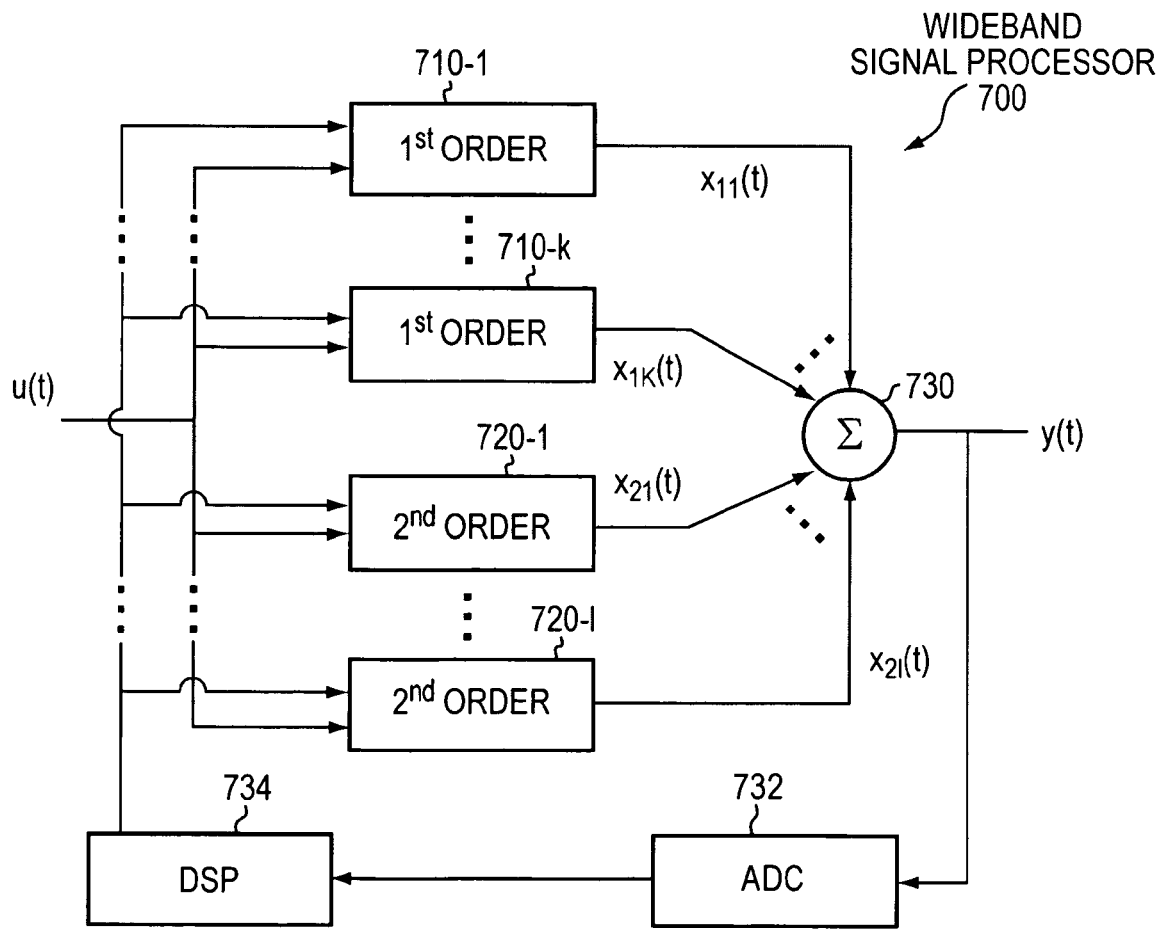
FIG. 7 is a block diagram of a wideband signal processor employing banks of parallel first- and second-order state variable filters.

FIG. 7 shows an alternative wideband signal processor 700 that includes banks of first-order state variable filters 710-1 through 710-k and second-order state variable filters 720-1 through 720-l, which may be as shown in FIGS. 1-3, as appropriate. The filters 710 and 720 operate in parallel on a wideband input u(t) to produce individual outputs $x_{11-1k}(t)$ and $x_{21-2l}(t)$, respectively, which are combined by a summer 730 to provide a processed output y(t). An ADC 732 digitizes the processed output and forwards the resulting digital signal to a DSP 734, which adjusts the gain coefficients of the variable gain blocks and fractional gain blocks of the filters 710 and 720 depending on the processor function being implemented.

For example, a processor 700 configured to perform spectrum analysis may sweep the filter center frequency by using the DSP 734 to ramp the scaled gain coefficients of the variable gain blocks from −1 to 1. Reprogramming the gain coefficients of the variable and fractional blocks changes the filter poles and residues, changing the passband width, shape, and center frequency of each filter 710a-k and 720a-l. The DSP 734 makes it possible to perform these adjustments dynamically and adaptively, making it possible to perform agile filtering, adaptive filtering, and other, similar signal processing tasks. In addition, individual filters can be effectively turned off by changing the coefficients of the variable and fractional gain blocks.

Figure 8:
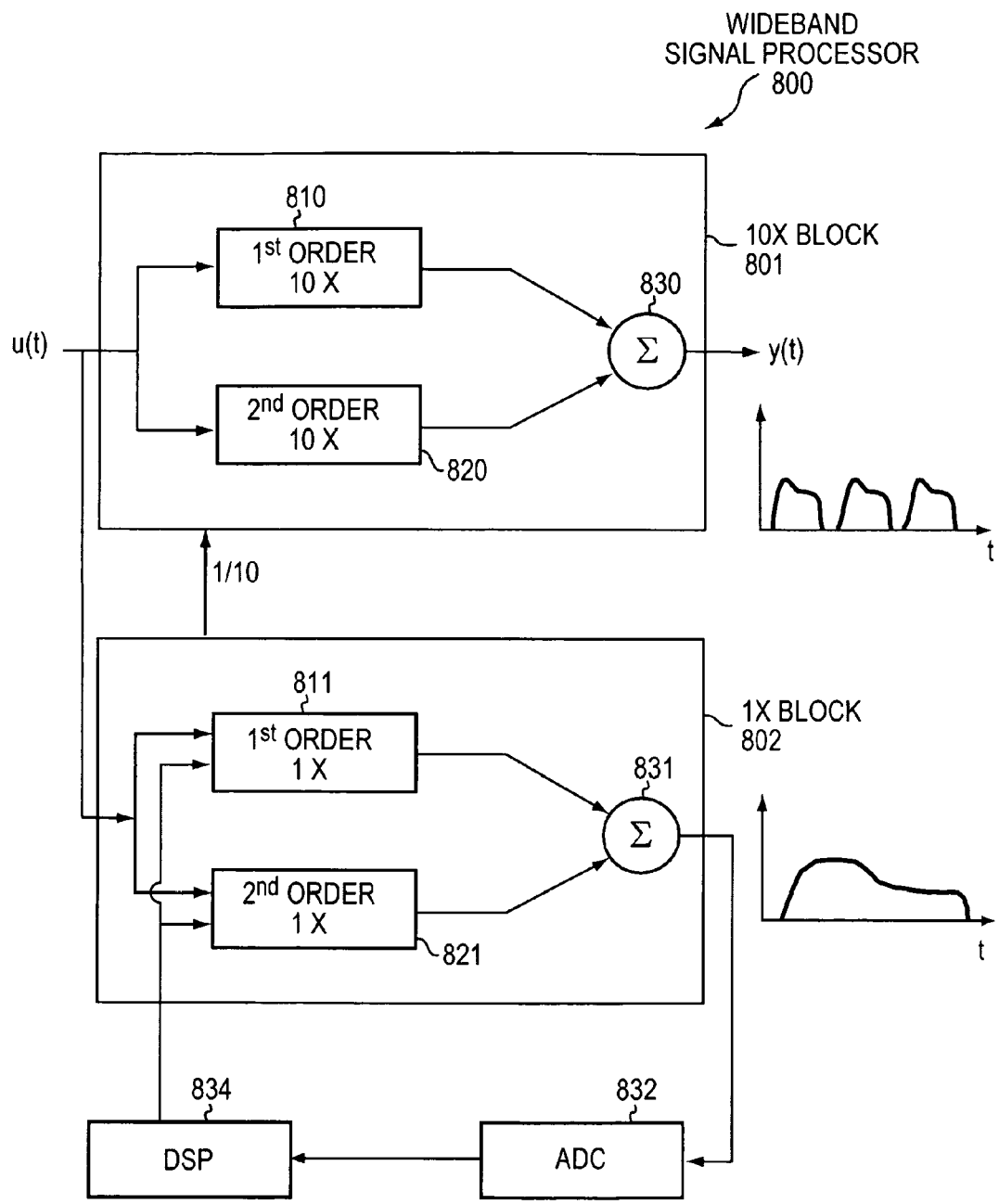
FIG. 8 is a block diagram of a wideband signal processor capable of stroboscopic signal processing.

FIG. 8 shows another alternative wideband signal processor 800 capable of stroboscopic measurement and control. The processor 800 includes a 10× filter block 801 and a 1× filter block 802 that operate in parallel on a wideband signal u(t). Each block 801 and 802 includes first- and second-order filters coupled in parallel to summers that provide processed outputs. In the 10× filter block 801, the first- and second-order filters 810 and 820 have variable and fractional gain blocks with gain coefficients that span a range of −1 to 1 and operate to provide the processed output y(t) 871.

In the 1× filter block 802, however, the gain coefficients of the first- and second-order filters 811 and 821 span a range of only −0.1 to 0.1. As a result, the output of the 1× filter block 802 is a low-passed version 872 of the processed output y(t) 871 (in this case, low-passed at one-tenth the frequency of the processed output). An ADC 832 digitizes the low-passed signal 872, which is coupled to a DSP 834. As shown in FIG. 8, low-pass filtering and digitization is equivalent to stroboscopically sampling the fullband output 871 at a strobe frequency equal to the ratio of gain spans. Filtering relaxes the sample rate requirements for the ADC 832, making it possible to use a relatively slow ADC 832 with a relatively large bit depth (i.e., a large dynamic range). The DSP 834 can also operate at lower sample rates, reducing its size, complexity, and power consumption.

As described above, the DSP 834 may dynamically or adaptively vary the coefficients of the gain blocks in the filters 811 and 821 in the 1× filter block 802. Because the two filter blocks 801 and 802 are linked, the gain coefficients of the 10× filter block 801 track changes to the coefficients of the 1× filter block 802 at ratio of 10:1. Thus, as the DSP 834 makes changes to adjust the low-passed signal 871, it also makes frequency-magnified versions of the same changes to the processed output 870.

Interference Detection and Rejection Using Reconfigurable State Variable Filters Early on, the concern with UWB systems was the impact of their signal on other systems. Since then, it has become clear that the key challenge to UWB system realization is that the large-bandwidth receiver front-end passes many interferers, making receiver operation difficult. Sample interferers include radars, data links, airport landing systems, and other RF systems, such as the IEEE 802.16e mobile system. Interferers are particularly troublesome in military applications, where high power radars can fall in-band.

Although there are signal processing techniques that allow extremely wideband systems to reject interferers, such interferers can drive the receiver RF circuitry into nonlinearity and destroy information reception before signal processing takes place. This necessitates an integrated approach that considers the entire receiver chain. Embodiments of the disclosed invention can detect and reject interferers using dynamically reconfigurable state variable filters configured to operate as spectrum analyzers and rejection filters, as described in greater detail below.

Example interference detection schemes include creating a frequency-agile, high-Q bandpass filter using the state variable techniques described above. The filter center frequency can be scanned across the UWB band to characterize the interference power across the band.

In general, the transfer function of a second-order filter is given by $$T_{ID}(s) = \frac{s}{s^2 + (\omega_r/Q)s + \omega_r^2} \quad (5)$$

where $\omega_r$ is the desired center frequency and Q is the quality factor. Normalizing the angular frequency to $\frac{1}{2}\pi$ Hz, i.e., $\omega_r=1$ rad/s, changes the form of the transfer function to $$\hat{T}_{ID}(s) = \frac{s}{s^2 + s/Q + 1} \quad (6)$$

which can be realized using the control and observer canonical state variable architectures shown in FIGS. 2 and 3, respectively. The center frequency of the bandpass filter can be swept across the UWB band by adjusting the value of the gain block, G. As this sweep is performed, the interference power across the UWB channel can be characterized.

Figure 9A:
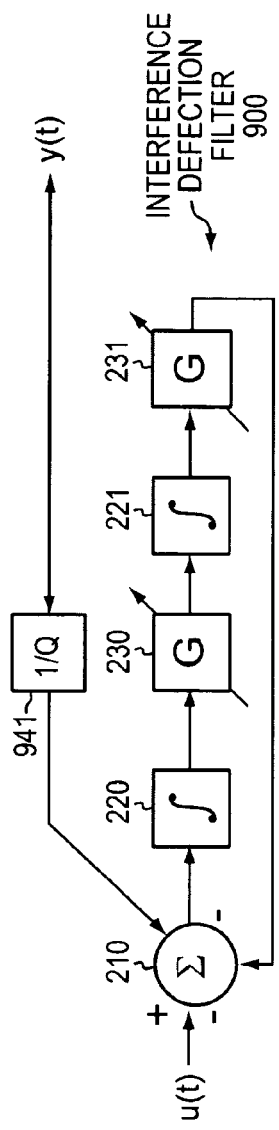
FIG. 9A is a block diagram of an interference detection filter.

FIG. 9A shows an interference detection filter 900 formed by manipulating the values of the fractional gain blocks 240-242 and 250-252 of the control second-order state variable filter 200 of FIG. 2. Specifically, the fractional gains of blocks 250 and 252 have been set to zero ($b_0=b_2=0$); the fractional gains of blocks 240, 242, and 251 have been set to one ($a_0=a_2=b_1=1$); and the fractional gain of block 941 has been set to the reciprocal of the quality factor ($a_1=1/Q$). The quality factor Q controls the shape and width of the filter passband. As discussed above, the filter gain G controls the center frequency.

Figure 9B:
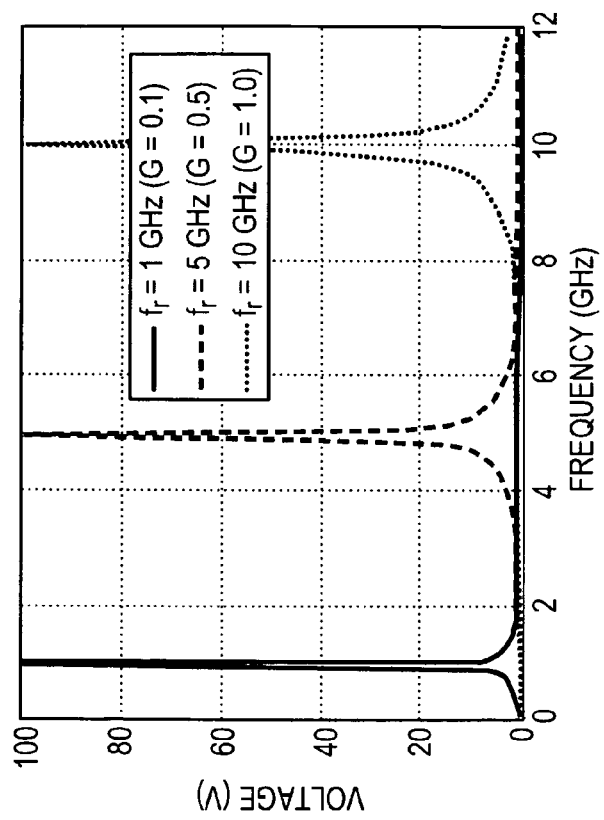
FIG. 9B is plot illustrating spectrum analysis using the interference detection filter shown in FIG. 9A.

FIG. 9B is a graph showing a UWB frequency sweep performed by the interference detection filter 900 of FIG. 9A. The sweep begins at 1 GHz by introducing a gain of k into the integration stage, with the secondary gain, G, set to 0.1. The system sweeps across the UWB band by increasing G incrementally from 0.1 to a final value of 1.0. Measuring the signal transmitted by the frequency-swept filter produces a spectral map of in-band interferers and noise sources.

Once the noise profile of the UWB band has been characterized, the state variable techniques described above may be applied to construct band-stop notch filters with controllable bandwidths and center frequencies. Placing these rejection filters at interferer and noise-source frequencies eliminates interference power and maximizes the signal-to-noise ratio (SNR). Consider, for example, a second-order band-stop notch filter with a transfer function of the form $$T_{IR}(s) = \frac{s^2 + \omega_r^2}{s^2 + (\omega_r/Q)s + \omega_r^2} \quad (7)$$

where $\omega_r$ is the desired center frequency and Q is the quality factor. By manipulating the coefficients and gain of the transfer function/state variable filter, the Q and center frequency of the notch can be modified.

Figure 10A:
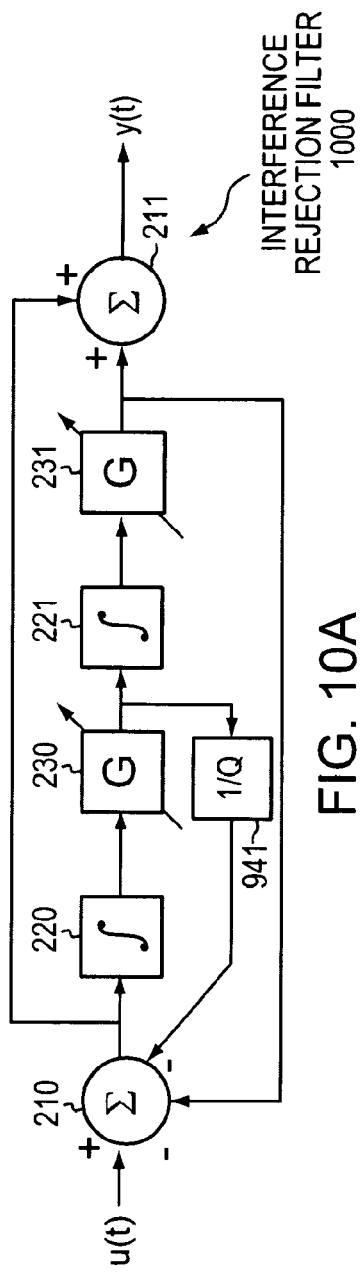
FIG. 10A is a block diagram of an interference rejection filter.

FIG. 10A shows an interference rejection (band-stop) filter 1000 formed by manipulating the values of the fractional gain blocks 240-242 and 250-252 of the control second-order state variable filter 200 of FIG. 2. Specifically, the fractional gain of blocks 250 and 251 have been set to zero ($b_0=b_1=0$); the fractional gains of blocks 240, 242, and 252 have been set to one ($a_0=a_2=b_2=1$); and the fractional gain of block 941 has been set to the reciprocal of the quality factor ($a_1=1/Q$). The quality factor Q controls the shape and width of the filter rejection band, and the filter gain G controls the center frequency.

Figure 10B:
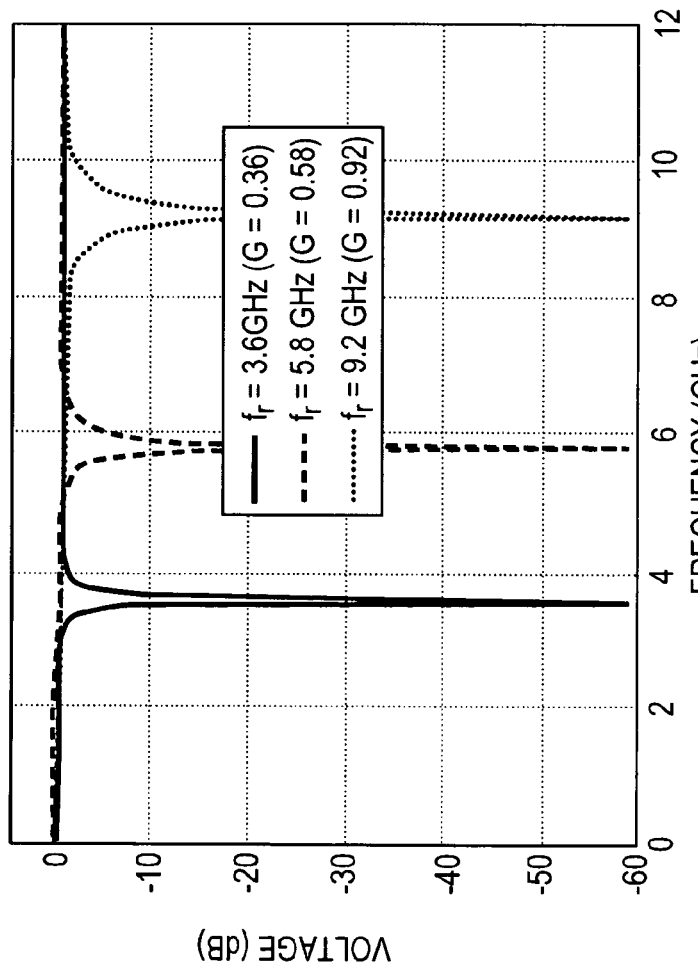
FIG. 10B is plot illustrating notch filtering using the interference rejection filter shown in FIG. 10A.

FIG. 10B shows the frequency response of band-stop filters 1000 centered at 3.6 GHz, 5.8 GHz, and 9.2 GHz with relative gains of 0.36, 0.58, and 0.92, respectively. The filter passband can be changed by changing the value of Q. If the interference spreads over slightly larger, but still relatively narrow bandwidths, multiple offset band stop notch filters can be cascaded to suppress interference.

Figure 11:
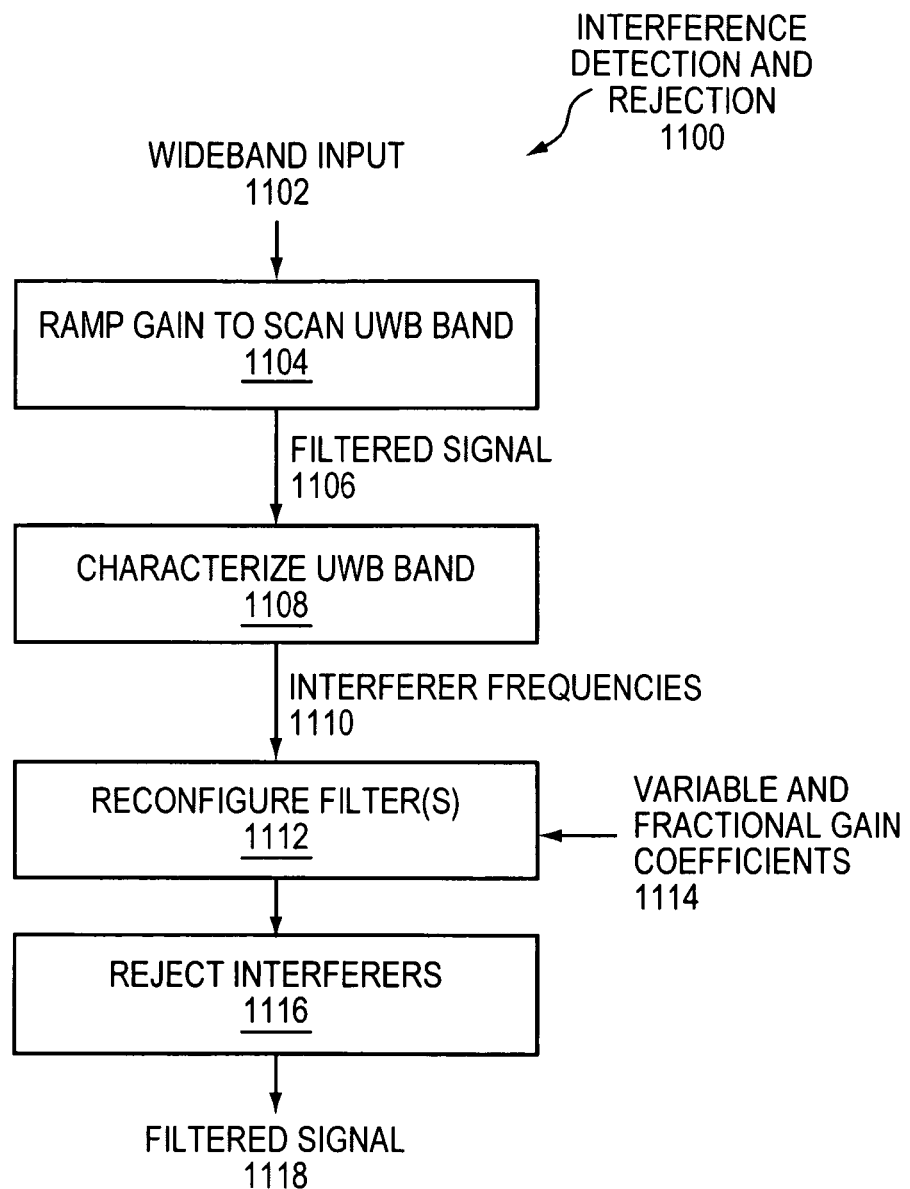
FIG. 11 is flow diagram that illustrates interference detection and rejection according to principles of the present invention.

FIG. 11 is a flow diagram that illustrates interference detection and rejection according to principles of the present invention. First, the band of interest (e.g., the UWB band) is scanned (1104) by ramping the variable gain of a state variable filter operating on a wideband input 1102 to produce a filtered signal 1106. As the filter center frequency scans across the band, the filtered signal 1106 can be used to characterize (1108) the band. Characterization (1108), or measurement, yields the frequency locations 1110 of in-band interferers. Next, band-stop, or rejection, filters are positioned at the interferer frequencies 1110 by reconfiguring (1112) state variable filters using dynamically adjustable variable and fractional gain coefficients 1114. The reconfigured band-stop filters reject (1116) the detected interferers to produce a filtered signal 1118.

RFID Using FSR-UWB Transceivers

RFID tags generally need to provide both robust communication and accurate location in very small, extremely low-power packages. In many environments, RFID communications also need to be immune to interference from both enemy jamming and friendly radars. Ultra-wideband (UWB) radio provides a promising solution for such applications, but UWB systems have always been dogged by implementation concerns caused by the difficulty in realizing a receiver for signals of extremely large bandwidth. In addition, the inherently wide receiver bandwidth of UWB systems makes them particularly susceptible to in-band interference and jamming.

Frequency-shifted reference (FSR)-UWB architectures address many of these implementation concerns in extremely low-power, modest data rate applications, including RFID. Embodiments of the present invention directly addressed these concerns by matching a new approach to interference mitigation in extremely wideband systems with a low-power transceiver implementation of our FSR-UWB solution. The result is a low-power, interference-rejecting system for RFID applications.

Embodiments of disclosed RFID technology include FSR-UWB systems for real-time location with low-power architectures, adaptive interference-suppression circuitry, and modified pulse shaping capability. For example, the disclosed FSR-UWB technology may enable a doctor to expeditiously locate a life saving equipment in a hospital. A factory in Detroit may use FSR-UWB technology to track products from a supplier in Singapore. A shipping company or logistics officer may check the contents and expiration date of a shipment without opening the carton. A safety officer at a chemical plant can track movement of workers in a hazardous area and pinpoint their locations when an accident occurs. The applications are almost limitless.

Competing RFID technologies cannot achieve the same localization precision as the disclosed FSR-UWB technology, nor can competing RFID technologies perform well in the same range of environments. RFID tags that operate at 433 MHz and 2.4 GHz perform poorly when mounted on metal or surfaces with high water content. They also have location resolutions of 3 m to 10 m, depending on the environment, which is inadequate for many emerging applications. In contrast, the disclosed FSR-UWB system is not affected by metal or water and it perform well in a multipath environment. It has low power consumption and can locate an asset with a resolution of better than 30 cm.

Figure 12:
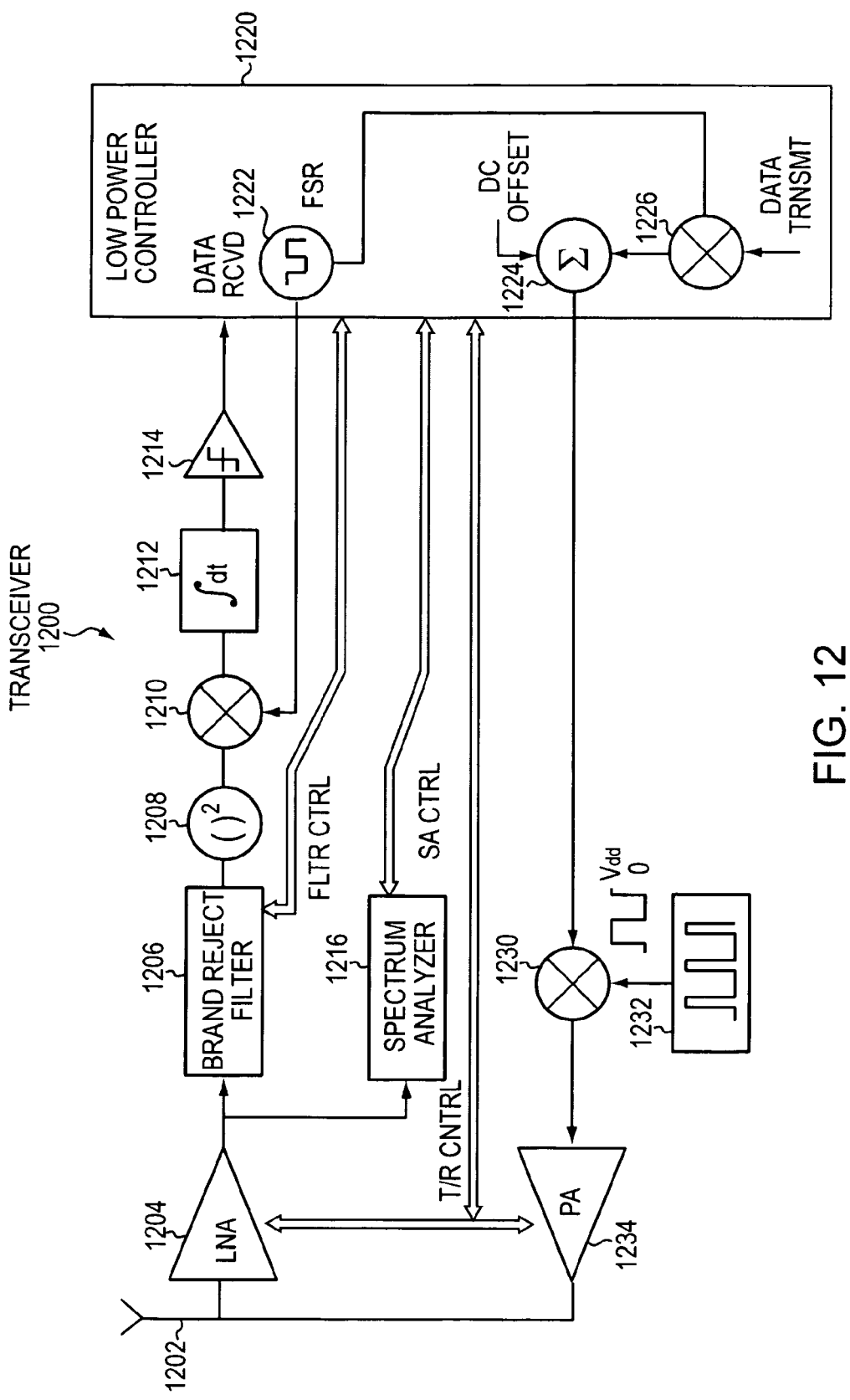
FIG. 12 is a block diagram of a transceiver employing a band-reject filter and spectrum analyzer.

FIG. 12 shows a block diagram of a transceiver 1200 suitable for use as an RFID tag or reader. An antenna 1202 transmits and receives UWB signals as controlled by a low-power controller 1220. The antenna 1202 may be a tapered slot antenna with a gain of 6 dBi. It may be printed on a thin piece of flexible dielectric, which may be folded to set a polarization angle and placed in a foam block for mechanical support.

The antenna 1202 couples received signals to a low-noise amplifier (LNA) 1204 that amplifies the received signals. The LNA 1204 forwards amplified versions of the received signals to a band-reject filter 1206 and a spectrum analyzer 1216 constructed using the state variable filters described above. The band-reject filter 1206 and the spectrum analyzer 1216 can be used to detect and suppress interferers, as described with reference to FIGS. 9A, 9B, 10A, and 10B. Output from the filter 1206 is squared with a squaring block 1208, down-converted using a mixer 1210 and a frequency-shifted reference (FSR) from a synthesizer 1222, integrated with an integrator 1212, and threshold detected with a thresholding amplifier 1214 to provide a data signal to the low-power controller 1220.

At the same time, the spectrum analyzer 1216 sweeps across the UWB band to detect interferers and noise sources based on control signals (SA CTRL) from the controller 1220. The controller 1220 adjusts the center frequency and quality factor of the band-reject filter 1206 using control signals (FLTR CTRL) to null received jammers, interferers, and other noise sources. The controller 1220 may also control the gains of the LNA 1204 and a power amplifier (PA) 1234 in the transmit path.

Transmitted data is up-converted using a mixer 1226 and the FSR from the synthesizer 1222, then combined with a DC offset using a summer 1224. The summer 1224 couples the resulting biased up-converted signal to another mixer 1230, which modulates the signal with a modulating waveform from a waveform generator 1232. The modulating waveform acts as gate; when the waveform pulses high (1), the mixer 1230 sends an output to the PA 1234, which amplifies the signal before it is transmitted using the antenna 1202. When the waveform pulses low (0), nothing is transmitted. Multi-channel transceivers use full-amplitude modulation instead of binary modulation.

In alternative embodiments, a single second-order state variable filter block (e.g., filter 200 in FIG. 2) may act as both a band-reject filter and a spectrum analyzer. The controller sets the filter fractional gain coefficients according to the values described with reference to the interference detection filter 900 shown in FIG. 9A, then sweeps the filter center frequency across the transceiver band to find interferers and the like. Once the controller completes the sweep, it resets the fractional gain coefficients according to the values described with reference to the interference rejection filter 1000 shown in FIG. 10A. The controller then sets the variable gain G to null the detected interferer.

Figure 13:
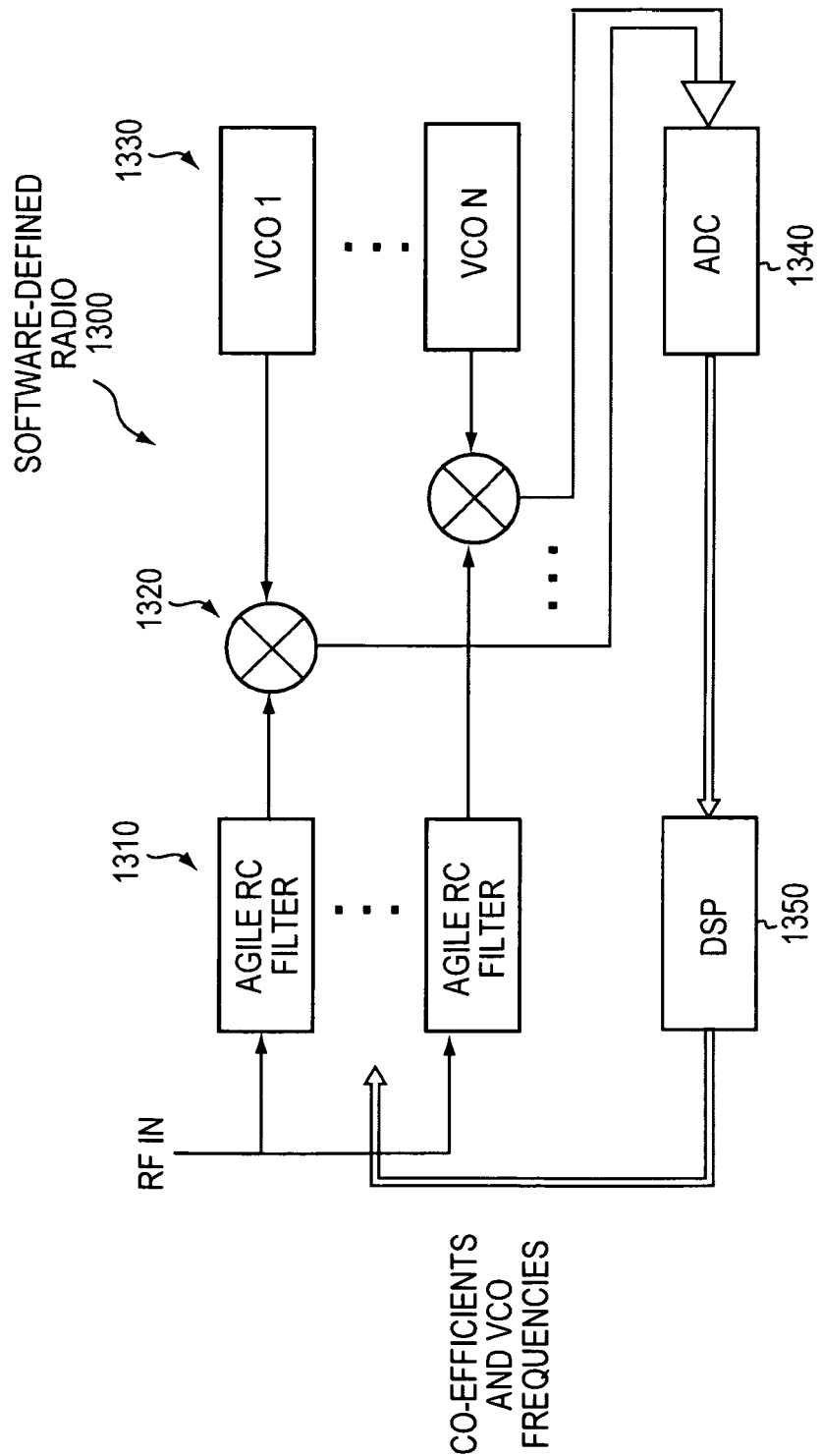
FIG. 13 is a block diagram of a software-defined radio employing a bank of agile filters.

Software-Defined and Cognitive Radio Using Reconfigurable State Variable Filters FIG. 13 shows a software-defined radio 1300 that uses a set of agile RC filters 1310 that operate according the state-variable techniques described above. The filters 1310 are coupled to respective mixers 1320, which provide baseband signals by beating filtered RF inputs against local oscillators from a set of voltage-controlled oscillators 1330. An ADC 1340 digitizes the baseband signals, which are processed by a DSP 1350. The DSP 1350 may vary the filter center frequencies and passbands in response to changes in the RF input, external controls, or internal programming. With appropriate programming, the DSP 1350 can act without outside control, thereby causing the software-defined radio 1300 to function as a cognitive radio.

Figure 14:
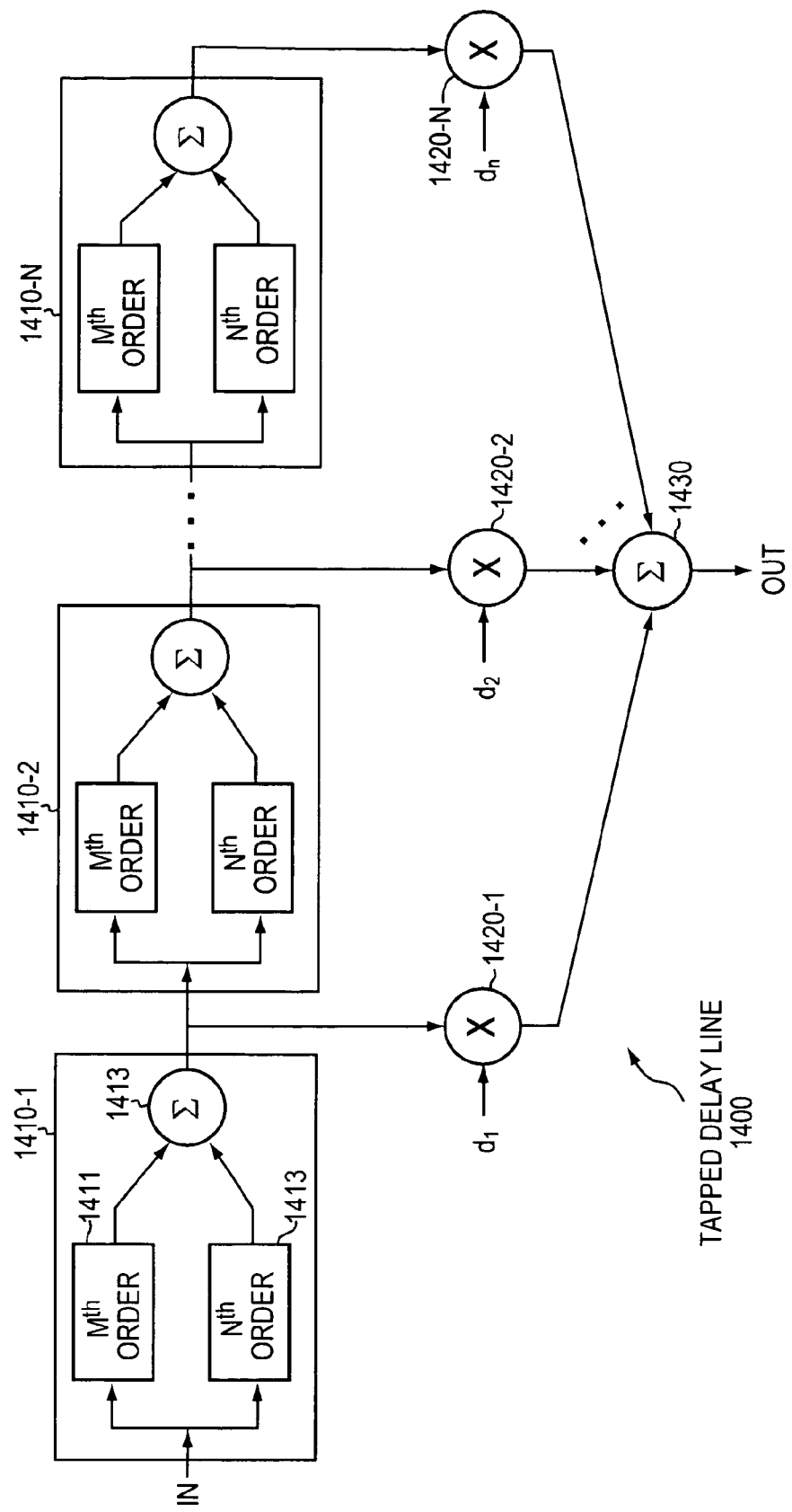
FIG. 14 is a block diagram of a tapped delay line employing second-order state variable filters.

Delay Lines, Correlators, and Equalizers Using Reconfigurable State Variable Filters FIG. 14 shows a tapped delay line 1400 similar to a Bessel filter-based delay line that can be configured to act as a correlator or an equalizer. The tapped delay line 1400 includes a set of N serially connected delay elements 1410-1 through 1410-N. Each delay element is a processor similar to the processor 100 shown in FIG. 1, where the processor order is determined by the desired filter corner frequency and passband ripple. In the delay line 1400, each delay element 1410 is a m+n order filter constructed by configuring an mth-order state variable filter and an nth-order state variable filter (e.g., filters 1411 and 1412) to operate in parallel on an input. A summer (e.g., summer 1413) combines the filter outputs to produce an incrementally delayed version of the input. The outputs of each delay element are scaled by a set of tap weights 1420-1 through 1420-N.

Typically, the delay element order is chosen depending on the desired delay characteristics. For example, picking n=m=2 fixes the delay element order at four (4), which, in turn, fixes the delay element corner frequency at roughly 1 rad/ns. Increasing the delay element order by adding more state variable filters or changing the state variable filter orders decreases the passband ripple, sharpens the corner, and increases the corner frequency.

The tapped delay line 1400 may be used in a correlator or equalizer for signals transmitted using a wireless network. Prolate spheroidal wave functions, introduced by D. Slepian in 1961, are particularly attractive basis functions for wireless networks because their periodic autocorrelations are substantially free of sidelobes. These equations are eigenfunctions of a differential operator arising from a Helmholtz equation on a prolate spheroidal coordinate:

$$(\tau^2 - t^2)\frac{d^2\varphi_{n,\sigma,\tau}(t)}{dt^2} - 2t\frac{d\varphi_{n,\sigma,\tau}(t)}{dt} - \sigma^2 t^2 \varphi_{n,\sigma,\tau}(t) = \mu_{n,\sigma,\tau}\varphi_{n,\sigma,\tau}(t).$$

Here, $\phi_{0,\sigma,\tau}(t)$ is the function of total energy such that $\int |f(t)|^2 dt$ is maximized and $\Phi_{1,\sigma,\tau}(t)$ is the function with the maximum energy concentration among those orthogonal to $\phi_{0,\sigma,\tau}(t)$, etc. Prolate spheroidal wave functions constitute an orthonormal basis of the space of σ-band-limited functions and are maximally concentrated on an interval $[-\tau, \tau]$ in a sense.

Figure 15:
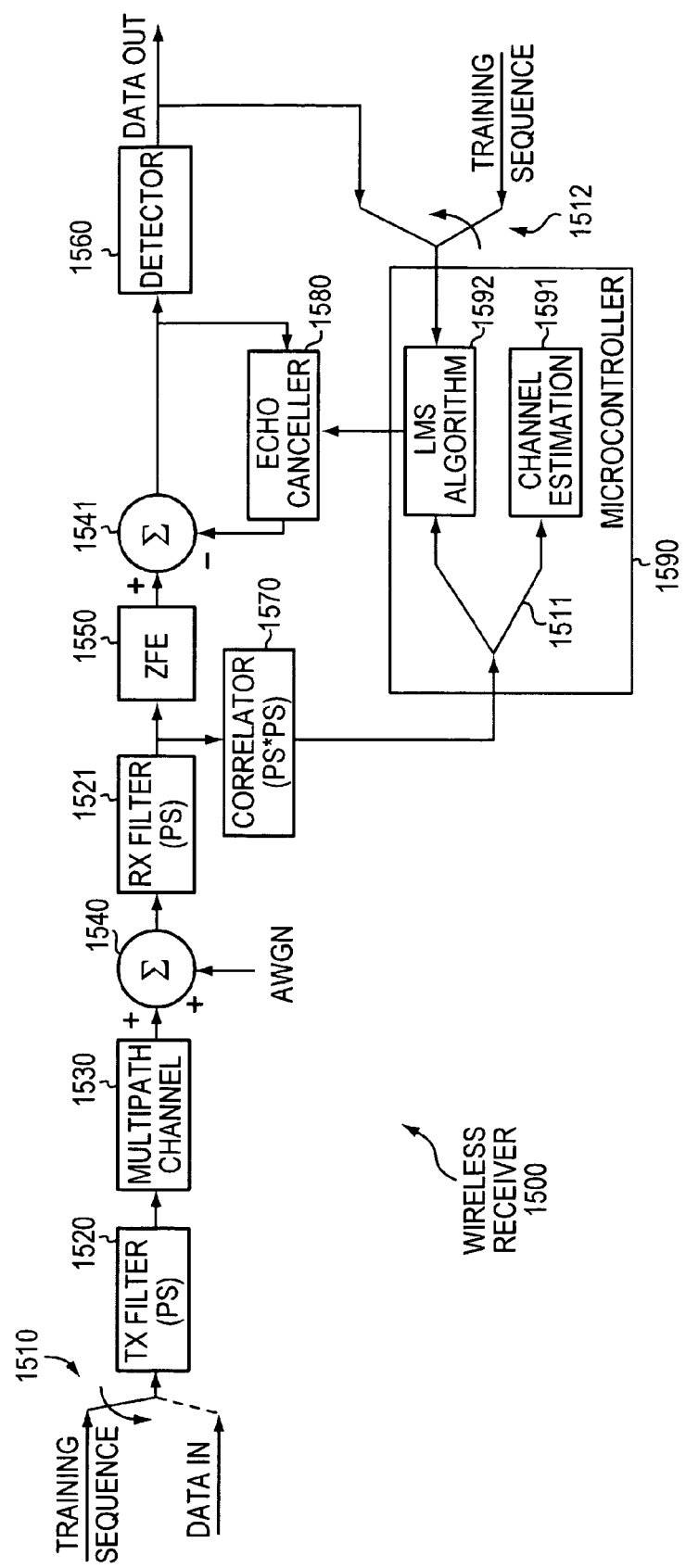
FIG. 15 is a block diagram of a wireless receiver employing a correlator based on the tapped delay line shown in FIG. 14.

FIG. 15 shows a wireless receiver 1500 that uses prolate spheroidal (PS) wave functions together with reconfigurable filters and tapped delay lines for channel equalization in UWB networks. Here, a wireless transmitter (not shown) emits a training signal, such as a prolate spheroidal wave function encoded with a Gold sequence or other modulation scheme with suitable cross-correlation qualities. A switch 1510 directs the received training signal to a transmit (Tx) filter 1520, which filters the signal, then sends it to a multipath channel selector 1530. A summer 1540 combines the output from the selector 1530 with averaged white Gaussian noise (AWGN); a receive (Rx) filter 1570 operates on the summer output and transmits the filtered summer output to a zero-forcing equalizer (ZFE) 1550 and a correlator 1570.

The correlator 1570, which may be based on the tapped delay line 1400 shown in FIG. 14, performs an autocorrelation of the received signal, then forwards the autocorrelation to a microprocessor 1590. The microprocessor 1590 determines the channel (i.e., environmental) characteristics by comparing the autocorrelation with either the output data or the training sequence, as determined by the setting of a switch 1512. A switch 1511 inside the microprocessor 1590 directs the autocorrelation to a least-mean-squares (LMS) processor 1592, possibly via a channel estimator 1591.

The LMS processor 1592 controls an echo canceller 1580, which operates in a loop between a summer 1541 and a detector 1560 to reduce multipath echoes in the output from the ZFE 1550. The ZFE 1550 may also be constructed using embodiments of the tapped delay line 1400 shown in FIG. 14 with appropriately chosen tap weights. Once the LMS processor 1592 converges to a solution that sets the ZFE settings to suppress multipath echoes, training ends, and the switches 1510-1512 can be set so that receiver 1500 operates on data instead of training sequences. The training sequences may be retransmitted periodically or as necessary due to environmental changes, etc.

Figure 16:
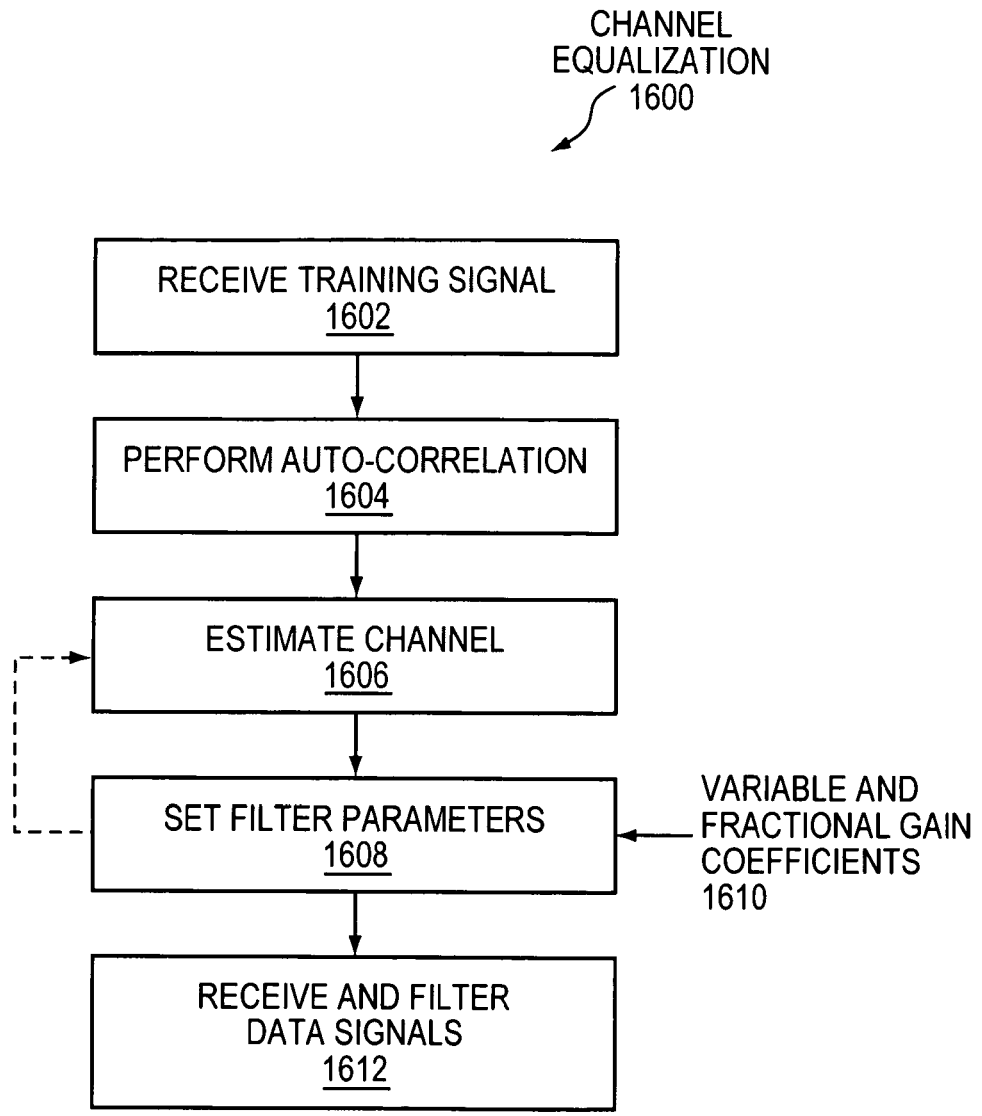
FIG. 16 is flow diagram that illustrates channel equalization according to principles of the present invention.

FIG. 16 is a flow diagram that illustrates channel equalization 1600 according to principles of the present invention. First, a training signal, such as a prolate spheroidal waveform encoded with a Gold code sequence, is received (1602) and possibly filtered at an analog front-end. Performing an autocorrelation (1604) on the received training signal yields information about received echo signals; the delay information encoded in the autocorrelation can be used to estimate (1606) channel parameters, including parameters describing multipath effects. Estimated channel parameters are then used to set (1608) filter parameters by changing variable and fractional gain coefficients 1610. In some embodiments, estimation and filtering setting (1610) may be done iteratively (i.e., in a feedback loop). Once the filter coefficients are set to equalize the channel path, training ends, and the data signals may be received and equalized 1612. Channel equalization 1600 may be repeated periodically or as necessary to compensate for changes in the signal environment.

While this invention has been particularly shown and described with references to example embodiments thereof, it will be understood by those skilled in the art that various changes in form and details may be made therein without departing from the scope of the invention encompassed by the appended claims.

What is claimed is:

1. A wideband signal processing apparatus comprising:
    an $m^{th}$-order state variable filter and an $n^{th}$-order state variable filter configured to operate on a wideband input in parallel, where m and n are positive integers; and
    a summer configured to add outputs from the $m^{th}$- and $n^{th}$-order state variable filters to produce a processed output;
    an analog-to-digital converter configured to produce a digital representation of the processed output; and
    a digital signal processor configured to control the $m^{th}$- and $n^{th}$-order state variable filters based on the digital representation of the processed output;
    wherein the digital signal processor is further configured to control center frequencies and transfer functions of the $m^{th}$- and $n^{th}$-order state variable filters by changing tap weights of the $m^{th}$- and $n^{th}$-order state variable filters or a DC voltage; where m and n are positive integers.

2. The wideband signal processing apparatus as claimed in claim 1, wherein the tap weights being adjustable to create a transfer function of the wideband signal processing apparatus.

3. The wideband signal processing apparatus as claimed in claim 1, wherein the digital signal processor is further configured to adjust the $m^{th}$- and $n^{th}$-order state variable filters to compensate for non-idealities of the $m^{th}$- and $n^{th}$-order state variable filters.

4. The wideband signal processing apparatus as claimed in claim 1, wherein the $m^{th}$-order state variable filter is a first-order state variable filter comprising:
    a residue block configured to provide a residue of the wideband input;
    a summer configured to combine a pole of a filtered output and the residue of the wideband input;
    an integrator configured to integrate an output of the summer; and
    a variable gain block configured to amplify an output of the integrator to provide the filtered output; and
    a pole block configured to provide the pole of the filtered output.

5. The wideband signal processing apparatus as claimed in claim 4, wherein a center frequency of the first-order state variable filter is controlled by varying a gain of the variable gain block.

6. The wideband signal processing apparatus as claimed in claim 4, wherein the $n^{th}$-order state variable filter is a second-order state variable filter comprising:
    a summer configured to combine at least one fractional gain with the wideband input;
    a first integrator configured to integrate an output of the summer;
    a first variable gain block configured to amplify an output of the first integrator to provide a first amplified signal;
    a second integrator configured to integrate a signal corresponding to the first amplified signal;
    a second variable gain block configured to amplify an output of the second integrator to provide a second amplified signal;

at least one fractional gain block configured to provide the at least one fractional gain factor based on the second amplified signal.

7. The wideband signal processing apparatus as claimed in claim 6, wherein a center frequency of the second-order state variable filter is configured to be controlled by varying gains of the first and second variable gain blocks.

8. The wideband signal processing apparatus as claimed in claim 6, wherein the first variable gain block provides a filtered output.

9. The wideband signal processing apparatus as claimed in claim 6, further including:
another summer configured to combine the output from the summer and the second amplified signal.

10. The wideband signal processing apparatus as claimed in claim 1, wherein m=n.

11. The wideband signal processing apparatus as claimed in claim 1, wherein m=1 and n=2.

12. The wideband signal processing apparatus as claimed in claim 1, further comprising a second $n^{th}$-order state variable filter configured to operate on the wideband input and operably coupled to an input of the summer.

13. A state variable filter comprising:
a residue block configured to provide a residue of a wideband input;
a summer configured to combine a pole of a filtered output and the residue of the wideband input;
an integrator configured to integrate an output of the summer; and
a variable gain block configured to amplify an output of the integrator to provide the filtered output; and
a pole block configured to provide the pole of the filtered output;
wherein the residue block, variable gain block, and pole block are configured to be controlled to compensate for non-idealities of the integrator.

14. The state variable filter as claimed in claim 13, wherein a center frequency of the state variable filter is configured to be controlled by a gain of the variable gain block.

15. The state variable filter as claimed in claim 13, wherein adjusting a voltage applied to the integrator changes a bandwidth of the state variable filter.

16. A state variable filter comprising:
a summer configured to combine at least one fractional gain with a wideband input;
a first integrator configured to integrate an output of the summer;
a first variable gain block configured to amplify an output of the first integrator to provide a first amplified signal;
a second integrator configured to integrate a signal corresponding to the first amplified signal;
a second variable gain block configured to amplify an output of the second integrator to provide a second amplified signal; and
at least one fractional gain block configured to provide the at least one fractional gain factor based on the second amplified signal;
wherein the fractional gain block, first variable gain block, and second variable gain block are configured to be controlled to compensate for non-idealities of the integrator.

17. The state variable filter as claimed in claim 16, wherein the state variable filter is in a control canonical form.

18. The state variable filter as claimed in claim 16, wherein the state variable filter is in an observer canonical form.

19. The state variable filter as claimed in claim 16, wherein a center frequency of the state variable filter is configured to be controlled by gains of the variable gain blocks.

20. The state variable filter as claimed in claim 16, wherein adjusting a voltage applied to the first or second integrator changes a bandwidth of the state variable filter.

21. The state variable filter as claimed in claim 16, wherein the first variable gain block provides a filtered output.

22. The state variable filter as claimed in claim 16, further including:
another summer configured to combine the output from the summer and the second amplified signal.

23. A method of filtering wideband signals comprising:
combining a pole of a filtered signal with a wideband input to provide a combined signal;
integrating the combined signal to provide an integrated signal; and
amplifying, by a variable gain block, the integrated signal by a gain G to provide the filtered signal, a filter center frequency scaled by the gain G;
scaling the filtered signal by a first tap weight to provide a first scaled signal;
coupling an unscaled version of the filtered signal to an input of another filter to provide another filtered signal;
scaling the another filtered signal by a second tap weight to provide a second scaled signal; and
combining the first and second scaled signals.

24. The method of filtering wideband signals as claimed in claim 23, further including:
determining a residue of a wideband signal to provide the wideband input.

25. The method of filtering wideband signals as claimed in claim 23, further including:
integrating the filtered signal to provide another integrated signal;
amplifying the another integrated signal to provide another filtered signal;
combining the another integrated signal with the combined signal before integrating the combined signal; and
adding the another filtered signal to a difference signal to provide an output.

26. The method of filtering wideband signals as claimed in claim 23, further including:
adjusting the pole to compensate for non-idealities when integrating the difference signal.

27. The method of filtering wideband signals as claimed in claim 23, further including:
changing a center frequency of the filtered signal by changing a gain of the integrated signal.

28. The method of filtering wideband signals as claimed in claim 27, further including:
measuring the filtered signal as a function of the gain.

29. The method of filtering wideband signals as claimed in claim 23, further including:
detecting a narrowband interferer; and
adjusting a gain of the integrated signal to reject the narrowband interferer.

30. The method of filtering wideband signals as claimed in claim 23, further including:
mixing the filtered signal with a local oscillator to produce an intermediate frequency signal; and
adjusting a gain of the integrated signal to tune the intermediate frequency signal.

31. The method of filtering wideband signals as claimed in claim 23, further including:
measuring the filtered signal to produce equalization factors when the wideband input is a training signal;
based on the equalization factors, adjusting a gain of the integrated signal to equalize the filtered signal.

* * * * *

UNITED STATES PATENT AND TRADEMARK OFFICE
CERTIFICATE OF CORRECTION

| | | |
|---|---|---|
| PATENT NO. | : 8,913,652 B2 | Page 1 of 1 |
| APPLICATION NO. | : 12/921987 | |
| DATED | : December 16, 2014 | |
| INVENTOR(S) | : Divi Gupta and Dev V. Gupta | |

It is certified that error appears in the above-identified patent and that said Letters Patent is hereby corrected as shown below:

In the Claims

In Column 16, Claim 1, line 27 delete "; where m and n are positive integers"

In Column 16, Claim 6, line 55 delete "4" and insert --1--

Signed and Sealed this
Seventh Day of April, 2015

Michelle K. Lee
*Director of the United States Patent and Trademark Office*